(12) United States Patent
Chung et al.

(10) Patent No.: US 11,482,163 B2
(45) Date of Patent: Oct. 25, 2022

(54) DISPLAY DEVICE

(71) Applicant: Samsung Display Co., LTD., Yongin-si (KR)

(72) Inventors: Jin Koo Chung, Suwon-si (KR); Dong Soo Kim, Hwaseong-si (KR); Taek Ju Jung, Hwaseong-si (KR); Seong Min Kim, Yongin-si (KR); Kyung Soo Jang, Suwon-si (KR); Kwang Chul Jung, Seoul (KR); Kyung Hyun Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/409,101

(22) Filed: Aug. 23, 2021

(65) Prior Publication Data
US 2021/0383747 A1 Dec. 9, 2021

Related U.S. Application Data

(63) Continuation of application No. 17/009,370, filed on Sep. 1, 2020, now Pat. No. 11,100,850.

(30) Foreign Application Priority Data

Jan. 30, 2020 (KR) ........................ 10-2020-0011083

(51) Int. Cl.
G09G 3/32 (2016.01)
(52) U.S. Cl.
CPC ....... G09G 3/32 (2013.01); G09G 2300/0426 (2013.01); G09G 2310/0278 (2013.01)

(58) Field of Classification Search
CPC ............ G09G 3/32; G09G 2300/0426; G09G 2310/0278
See application file for complete search history.

(56) References Cited

U.S. PATENT DOCUMENTS 9,704,424 B2 7/2017 Sun
2015/0162391 A1 6/2015 Kim
2016/0203748 A1 7/2016 Matsueda et al.
(Continued)

FOREIGN PATENT DOCUMENTS

EP 3 790 053 3/2021
JP 2016-81531 5/2016
(Continued)

OTHER PUBLICATIONS

Extended European Search Report corresponding with European Patent Application or Patent No. 21153156.1 dated Jul. 5, 2021.

Primary Examiner — Sejoon Ahn
(74) Attorney, Agent, or Firm — Kile Park Reed & Houtteman PLLC

(57) ABSTRACT

A display device includes scan lines disposed in a first direction; data lines disposed in a second direction substantially perpendicular to the first direction; and unit pixel regions adjacent to the scan lines and the data lines, each unit pixel region including sub-pixels. A portion of an opening region of at least one of the sub-pixels overlaps a unit pixel region adjacent to a unit pixel region corresponding to the at least one of the sub-pixels, and a side of the opening region of the at least one of the sub-pixels extends in a third direction inclined with respect to each of the first direction and the second direction.

20 Claims, 19 Drawing Sheets

(56) References Cited

U.S. PATENT DOCUMENTS

| | | |
|---|---|---|
| 2016/0322433 A1 | 11/2016 | Kim et al. |
| 2019/0221170 A1 | 7/2019 | Yamazaki et al. |
| 2019/0221180 A1 | 7/2019 | Li |
| 2019/0221183 A1* | 7/2019 | Hou ..................... G09G 3/3696 |
| 2019/0221420 A1* | 7/2019 | Winarski ................ H01J 61/78 |
| 2020/0168674 A1 | 5/2020 | Tan et al. |

FOREIGN PATENT DOCUMENTS

| | | |
|---|---|---|
| KR | 10-2015-0084573 | 7/2015 |
| KR | 10-2016-0065397 | 6/2016 |
| WO | 2019/153942 | 8/2019 |

\* cited by examiner

OR: OR1, OR2
OG: OG1, OG2
OB: OB1, OB2

DISPLAY DEVICE

CROSS-REFERENCE TO RELATED APPLICATION(S)

This is a continuation application of U.S. patent application Ser. No. 17/009,370, filed Sep. 1, 2020 (now issued as U.S. Pat. No. 11,100,850), the disclosure of which is incorporated herein by reference in its entirety. U.S. patent application Ser. No. 17/009,370 claims priority to and benefit of Korean Patent Application No. 10-2020-0011083 under 35 U.S.C. § 119, filed on Jan. 30, 2020, in the Korean Intellectual Property Office, the entire contents of which are incorporated herein by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions.

The display device may be applied to a center information display (CID) disposed on an instrument board, a center fascia, or a dashboard of a vehicle. In this case, external light may be reflected by the display device to interfere with a driver's view. As an example, the display device may include pixels as a minimum unit that may output light, and each of the pixels may output light through an opening region. For example, external light may be reflected at the boundary of the opening regions of the pixels, which may interfere with the driver's view.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that may reduce external light reflected at a boundary of an opening region of each of pixels.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, there is provided a display device that may include scan lines disposed in a first direction; data lines disposed in a second direction substantially perpendicular to the first direction; and a plurality of unit pixel regions adjacent to the scan lines and the data lines, each unit pixel region including a plurality of sub-pixels, wherein a portion of an opening region of at least one of the plurality of sub-pixels may overlap a unit pixel region adjacent to a unit pixel region corresponding to the at least one of the plurality of sub-pixels, and a side of the opening region of the at least one of the plurality of sub-pixels may extend in a third direction inclined with respect to each of the first direction and the second direction.

Each of the plurality of unit pixel regions may include first to third sub-pixels, and a first opening region of the first sub-pixel and a second opening region of the second sub-pixel may be disposed at a side of a third opening region of the third sub-pixel in the third direction.

The first opening region may be disposed at a side of the second opening region in a fourth direction, and the fourth direction may be substantially perpendicular to the third direction.

A portion of the third opening region may overlap a unit pixel region adjacent to a side, in the first direction, of a unit pixel region corresponding to the third opening region, and another portion of the third opening region may overlap a unit pixel region adjacent to a side, in the second direction, of the unit pixel region corresponding to the third opening region.

Each of the plurality of unit pixel regions may include first to third sub-pixels, a first opening region of the first sub-pixel and a second opening region of the second sub-pixel may be disposed at another side of a third opening region of the third sub-pixel in a fourth direction, and the fourth direction may be substantially perpendicular to the third direction.

The plurality of unit pixel regions may include a first unit pixel region and a second unit pixel region adjacent to a side of the first unit pixel region in the first direction, a first opening region of the first unit pixel region may be disposed at a side of a second opening region of the first unit pixel region in the third direction, and a first opening region of the second unit pixel region may be disposed at another side of a second opening region of the second unit pixel region in the fourth direction.

The plurality of unit pixel regions may further include a third unit pixel region adjacent to a side of the first unit pixel region in the second direction, and a fourth unit pixel region adjacent to a side of the second unit pixel region in the second direction, a portion of the second opening region of the first unit pixel region may overlap the third unit pixel region, and a portion of the first opening region of the second unit pixel region may overlap the fourth unit pixel region.

A portion of a third opening region of the third unit pixel region may overlap the first unit pixel region, and another portion of the third opening region of the third unit pixel region may overlap the fourth unit pixel region.

The display device may further include a first substrate on which the plurality of unit pixel regions may be disposed, and a second substrate facing the first substrate, wherein the plurality of unit pixel regions may include a first unit pixel region, and a second unit pixel region adjacent to a side of the first unit pixel region in the first direction, the first unit pixel region may include first to third sub-pixels, and a first spacer disposed between the first substrate and the second substrate, and the second unit pixel region may include first to third sub-pixels, and a second spacer disposed between the first substrate and the second substrate.

A first opening region of the first sub-pixel of the first unit pixel region and a second opening region of the second sub-pixel of the first unit pixel region may be disposed at another side of a third opening region of the third sub-pixel in a fourth direction substantially perpendicular to the third direction, the first opening region of the first unit pixel region may be disposed at a side of the second opening region in the third direction, and the first spacer may be disposed between the first opening region and the third opening region of the first unit pixel region.

A first opening region of the first sub-pixel of the second unit pixel region and a second opening region of the second sub-pixel of the second unit pixel region may be disposed at another side of a third opening region of the third sub-pixel in a fourth direction substantially perpendicular to the third direction, the first opening region of the second unit pixel region may be disposed at another side of the second opening region in the fourth direction, and the second spacer may be disposed at a side of the second and third opening regions of the second unit pixel region in the third direction.

The plurality of unit pixel regions may include a third unit pixel region adjacent to a side of the first unit pixel region in the second direction, and a fourth unit pixel region adjacent to a side of the second unit pixel region in the second direction, a portion of a second opening region of the second sub-pixel of the first unit pixel region may overlap the third unit pixel region, and a portion of a first opening region of the first sub-pixel of the second unit pixel region may overlap the fourth unit pixel region.

A portion of a third opening region of a third sub-pixel of the third unit pixel region may overlap the first unit pixel region, and another portion of the third opening region of the third sub-pixel of the third unit pixel region may overlap the fourth unit pixel region.

The display device may further include a first substrate on which the plurality of unit pixel regions may be disposed, and a second substrate facing the first substrate, wherein the plurality of unit pixel regions may include a first unit pixel region, and a second unit pixel region adjacent to a side of the first unit pixel region in the first direction, the first unit pixel region may include first to third sub-pixels, and first and second spacers disposed between the first substrate and the second substrate, and the second unit pixel region may include first to third sub-pixels, and third and fourth spacers disposed between the first substrate and the second substrate.

A first opening region of the first sub-pixel and a second opening region of the second sub-pixel may be disposed at another side of a third opening region of the third sub-pixel in a fourth direction substantially perpendicular to the third direction, a first opening region of the first unit pixel region may be disposed at a side of a second opening region of the first unit pixel region in the third direction, and a first opening region of the second unit pixel region may be disposed at another side of a second opening region of the second unit pixel region in the fourth direction.

The first spacer may be disposed at another side of the first opening region of the first unit pixel region in the second direction and at another side of the third opening region of the first unit pixel region in the first direction, and wherein the second spacer may be disposed on one side of the second opening region of the first unit pixel region in the first direction and at a side of the third opening region of the first unit pixel region in the second direction.

The third spacer may be disposed at another side of the second opening region of the second unit pixel region in the second direction and at another side of the third opening region of the second unit pixel region in the first direction, and the fourth spacer may be disposed at a side of the second opening region of the second unit pixel region in the first direction and at a side of the third opening region of the second unit pixel region in the second direction.

A first opening region of the first unit pixel region may include a central portion; a first protrusion protruding from the central portion to a side of the third direction; a second protrusion protruding from the central portion toward a third opening region; and a third protrusion protruding from the central portion in a direction opposite to the second protrusion.

A second opening region of the first unit pixel region may include: a central portion; a first protrusion protruding from the central portion to another side of the third direction; a second protrusion protruding from the central portion toward a third opening region; and a third protrusion protruding from the central portion in a direction opposite to the second protrusion.

A third opening region of the first unit pixel region may include a central portion; a first protrusion protruding from the central portion toward first and second opening regions; a second protrusion protruding from the central portion to another side of the third direction; a third protrusion protruding from the central portion in a direction opposite to the first protrusion; and a fourth protrusion protruding from the central portion in a direction opposite to the second protrusion.

Each of the plurality of unit pixel regions may include first to third sub-pixels, a first opening region of the first sub-pixel and a second opening region of the second sub-pixel may be disposed at a side of a third opening region of the third sub-pixel in a fourth direction substantially perpendicular to the third direction, and the third opening region may include a central portion, and a protrusion protruding from a lower corner of the central portion to a side of the second direction.

The plurality of unit pixel regions may include a first unit pixel region, and a second unit pixel region adjacent to a side of the first unit pixel region in the first direction, an end of a protrusion of a third opening region of the first unit pixel region may face a second opening region of the first unit pixel region, and another end substantially perpendicular to the end of the protrusion of the third opening region may face a first opening region of the second unit pixel region.

The first unit pixel region may include a first spacer surrounded by the first opening region, the end of the protrusion of the third opening region, and a left corner of the central portion of the third opening region.

The second unit pixel region may include a second spacer surrounded by a right corner of the central portion of the third opening region of the first unit pixel region, another end of the protrusion of the third opening region of the first unit pixel region, the second opening region of the second unit pixel region, and a left corner of the central portion of the third opening region of the second unit pixel region.

The plurality of unit pixel regions may include a first unit pixel region, and a second unit pixel region adjacent to a side of the first unit pixel region in the first direction, each of the first and second unit pixel regions may include first to third sub-pixels, a first opening region of the first sub-pixel and a second opening region of the second sub-pixel may be disposed at another side of a third opening region of the third sub-pixel in a fourth direction substantially perpendicular to the third direction, and the third opening region may include an end extending from a center of gravity to a side of the third direction and another end extending from the center of gravity to a side of the fourth direction.

The first and second opening regions of the first unit pixel region may be disposed at another side in the fourth direction at an end of the third opening region of the first unit pixel region, and the first and second opening regions of the second unit pixel region may be disposed at another side in the third direction at another end of the third opening region of the first unit pixel region.

The plurality of unit pixel regions may further include a third unit pixel region having first to third sub-pixels adjacent to a side of the first unit pixel region in the second direction, and the third unit pixel region may include a first spacer surrounded by the second and third opening regions of the first unit pixel region, the first opening region of the second unit pixel region, and the third opening region of the third unit pixel region.

According to an embodiment, there is provided a display device that may include scan lines disposed in a first direction; data lines disposed in a second direction substantially perpendicular to the first direction; and a plurality of unit pixel regions adjacent to the scan lines and the data lines, each unit pixel region including a plurality of sub-pixels, a portion of an opening region of at least one of the plurality of sub-pixels may overlap a unit pixel region adjacent to a unit pixel region corresponding to the at least one of the plurality of sub-pixels, and an extension direction of at least one side of the opening region of each of the plurality of sub-pixels may intersect all boundaries of the unit pixel region corresponding to the at least one of the plurality of sub-pixels at an acute angle.

In the display device according to the embodiments, one side of the opening region of each of the sub-pixels and the scan line may cross each other in a plan view. For example, one side of the opening region of each of the sub-pixels may not be parallel to the scan line in a plan view, and may not cross the scan line at a right angle in a plan view. In addition, a portion of at least one opening region of the opening regions of the sub-pixel may overlap the adjacent unit pixel region beyond the corresponding unit pixel region. Therefore, the display device can maximize the aperture ratio of each of the sub-pixels while minimizing the external light reflected at the boundary of the opening region.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
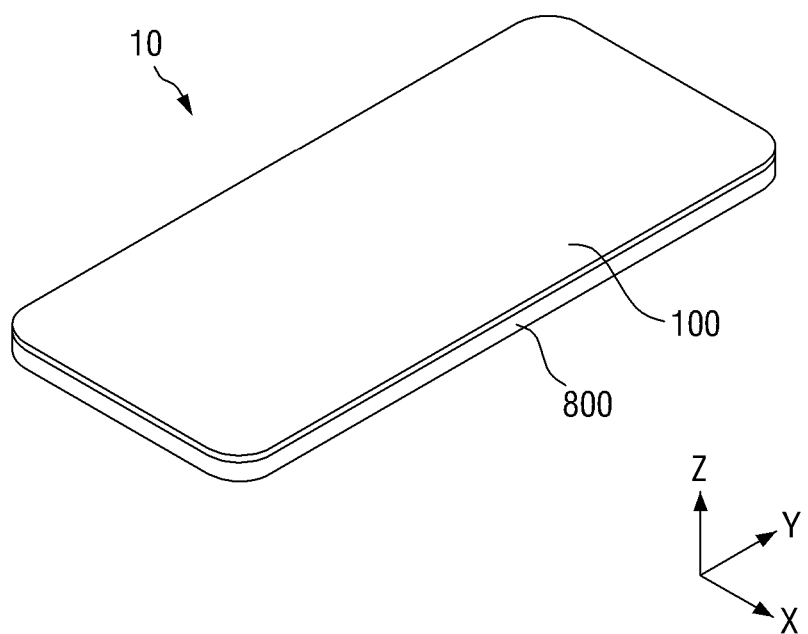
FIG. 1 is a perspective view illustrating a display device according to an embodiment.

Features and methods of accomplishing the same may be understood more readily by reference to the following detailed description of embodiments and the accompanying drawings. The disclosure may, however, be embodied in many different forms and should not be construed as being limited to the embodiments set forth herein. Rather, these embodiments are provided so that this disclosure will be thorough and complete and will fully convey the disclosure to those skilled in the art, and the disclosure will be defined by the appended claims.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms such as 'first' and 'second' are used herein to describe various elements, these elements should not be limited by these terms. It will be understood that although the terms such as 'first' and 'second' are used herein to describe various elements, these elements should not be limited by these terms. For example, a first element referred to as a first element in one embodiment may be referred to as a second element in another embodiment without departing from the scope of the appended claims.

As used herein, the singular forms "a," "an," and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Further, in the specification, the phrase "in a plan view" means when an object portion is viewed from above, and the phrase "in a schematic cross-sectional view" means when a schematic cross-section taken by vertically cutting an object portion is viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments will hereinafter be described with reference to the accompanying drawings.

Figure 2:
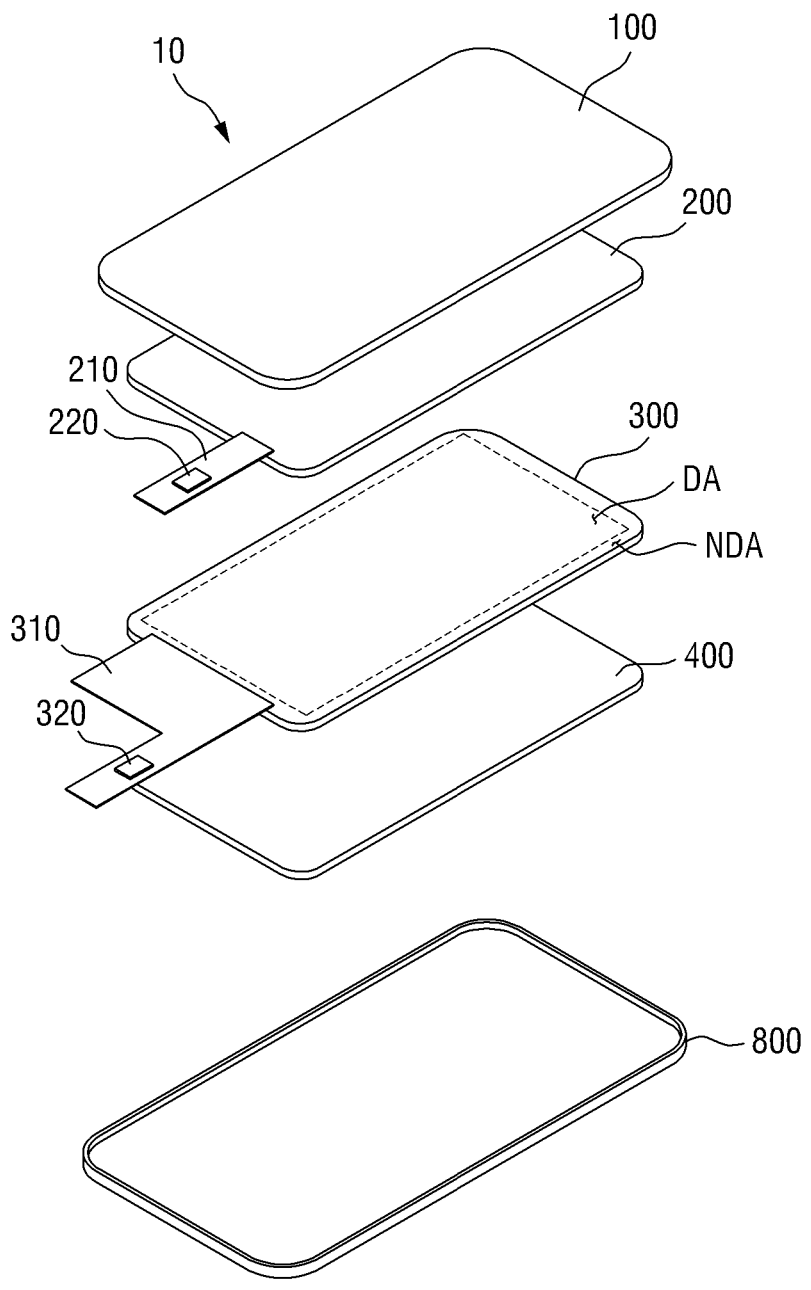
FIG. 2 is an exploded perspective view illustrating the display device of FIG. 1.

FIG. 1 is a perspective view illustrating a display device according to an embodiment. FIG. 2 is an exploded perspective view illustrating the display device of FIG. 1.

The terms "above," "top" and "upper surface" as used herein refer to an upward direction (i.e., a Z-axis direction) with respect to the display device. The terms "below," "bottom" and "lower surface" as used herein refer to a downward direction (i.e., a direction opposite to the Z-axis direction) with respect to the display device. Further, "left", "right", "upper" and "lower" indicate directions when the display device is viewed from above. For example, "left" refers to a direction opposite to an X-axis direction, "right"

refers to the X-axis direction, "upper" refers to a Y-axis direction, and "lower" refers to a direction opposite to the Y-axis direction.

Referring to FIGS. 1 and 2, a display device 10 is a device that may display a moving image or a still image. The display device may be used as a display screen of various products such as televisions, laptop computers, monitors, billboards and the Internet of Things (IOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs). However, the disclosure is not limited thereto and other products are within the spirit and the scope of the disclosure.

The display device 10 may have a substantially rectangular shape in a plan view. For example, the display device 10 may have a substantially rectangular shape in a plan view, having short sides in a first direction (X-axis direction) and long sides in a second direction (Y-axis direction). A corner where the short side in the first direction (X-axis direction) and the long side in the second direction (Y-axis direction) meet may be right-angled or rounded with a predetermined curvature. The planar shape of the display device 10 is not limited to a substantially rectangular shape, and may be formed in other substantially polygonal shapes such as a circular shape or elliptical shape. The display device 10 may be formed to be flat, but is not limited thereto. For example, the display device 10 may be formed to be bent with a predetermined curvature.

The display device 10 may include a cover window 100, a touch sensing device 200, a display panel 300, a panel bottom member 400, and a bottom cover 800.

The cover window 100 may be disposed above the display panel 300 to cover or overlap the top surface of the display panel 300. The cover window 100 may protect the top surface of the display panel 300. For example, the cover window 100 may be attached to the touch sensing device 200 through an adhesive member. The adhesive member may be an optically clear adhesive (OCA) or an optically clear resin (OCR).

The cover window 100 may include a transmission part which may display an image of the display panel 300, and a light blocking part which may correspond to a region other than the transmission part. The light blocking part of the cover window 100 may be formed to be opaque such that unnecessary components other than an image of the display panel 300 may not be viewed by a user. Alternatively, the light blocking part of the cover window 100 may be formed as a decorative layer having a pattern that may be shown to the user in a case that an image is not displayed. For example, the light blocking part of the cover window 100 may include a company's logo or a pattern of various characters.

For example, the cover window 100 may be made of glass, sapphire, or plastic, but is not necessarily limited thereto. The cover window 100 may be rigid or flexible.

The touch sensing device 200 may be disposed between the cover window 100 and the display panel 300. The touch sensing device 200 may detect the user's touch position and may be implemented as an infrared type or a capacitance type such as a self-capacitance type or a mutual capacitance type.

The touch sensing device 200 may be disposed on an upper substrate of the display panel 300. Alternatively, the touch sensing device 200 may be formed integrally with the display panel 300. In this case, the upper substrate of the display panel 300 may be omitted, and the touch sensing device 200 may be formed on an encapsulation layer of the display panel 300. For example, the touch sensing device 200 may include a pressure sensor that may sense the user's pressure.

For example, the display device 10 may include a polarizing film (not shown) disposed on the touch sensing device 200 in order to prevent a decrease in visibility of the image displayed by the display panel 300 due to external light reflected by the layers of the touch sensing device 200 or the layers of the display panel 300.

The touch sensing device 200 may include a touch circuit board 210 and a touch driver 220.

The touch circuit board 210 may be disposed at a side of the touch sensing device 200. For example, the touch circuit board 210 may be attached onto pads provided or disposed at a side of the touch sensing device 200 using an anisotropic conductive film. The touch circuit board 210 may include a touch connection terminal, and the touch connection terminal may be electrically connected to a connector of the display circuit board 310. The touch circuit board 210 may be a flexible printed circuit board or a chip on film.

The touch driver 220 may apply touch driving signals to the touch sensing device 200, receive sensing signals from the touch sensing device 200, and analyze the sensing signals to calculate the user's touch position. The touch driver 220 may be formed as an integrated circuit and mounted on the touch circuit board 210.

The display panel 300 may include a display circuit board 310 and a display driver 320.

The display circuit board 310 may be attached to a side of the display panel 300. For example, one end of the display circuit board 310 may be attached onto pads provided or disposed at a side of the display panel 300 using an anisotropic conductive film. The other end of the display circuit board 310 may be attached on the bottom surface of the panel bottom member 400 using an adhesive member. The touch circuit board 210 and the display circuit board 310 may be flexible printed circuit boards, and may be bent from the top to the bottom of the display panel 300. The display circuit board 310 may be electrically connected to a touch connection terminal of the touch circuit board 210 through a connector.

The display driver 320 may supply signals and voltages that may drive the display panel 300 through the display circuit board 310. For example, the display driver 320 may receive digital video data and timing signals from the outside, convert the digital video data into analog positive/negative data voltages, and supply them to data lines through the pads. The display driver 320 may supply a scan control signal that may control the scan driver through scan control lines. The display driver 320 may supply source voltages necessary for driving sub-pixels of the display panel 300 to the pads.

The display driver 320 may be formed as an integrated circuit and mounted on the display circuit board 310, but the disclosure is not limited thereto. For example, the display driver 320 may be attached to a side of the display panel 300.

The panel bottom member 400 may be disposed on a bottom surface of the display panel 300. For example, the panel bottom member 400 may include at least one of a heat dissipation layer that may efficiently dissipate heat of the display panel 300, an electromagnetic shielding layer that may shield electromagnetic waves, a light blocking layer that may block light incident from the outside, or a cushion layer that may absorb shock from the outside.

The bottom cover 800 may be disposed below the panel bottom member 400. The bottom cover 800 may form an external appearance of a bottom surface of the display device 10. The bottom cover 800 may be formed in a substantially bowl shape to accommodate the display panel 300. The sidewalls of the bottom cover 800 may be in contact with edges of the cover window 100. In this case, the sidewalls of the bottom cover 800 may be bonded to the edges of the cover window 100 through an adhesive member.

The bottom cover 800 may be fastened to the panel bottom member 400 through a fixing member such as a screw or attached to the panel bottom member 400 through an adhesive member such as an adhesive or an adhesive tape. The bottom cover 800 may include plastic and/or metal. The bottom cover 800 may include stainless steel (SUS) or aluminum (Al) to increase a heat dissipation effect.

Figure 3:
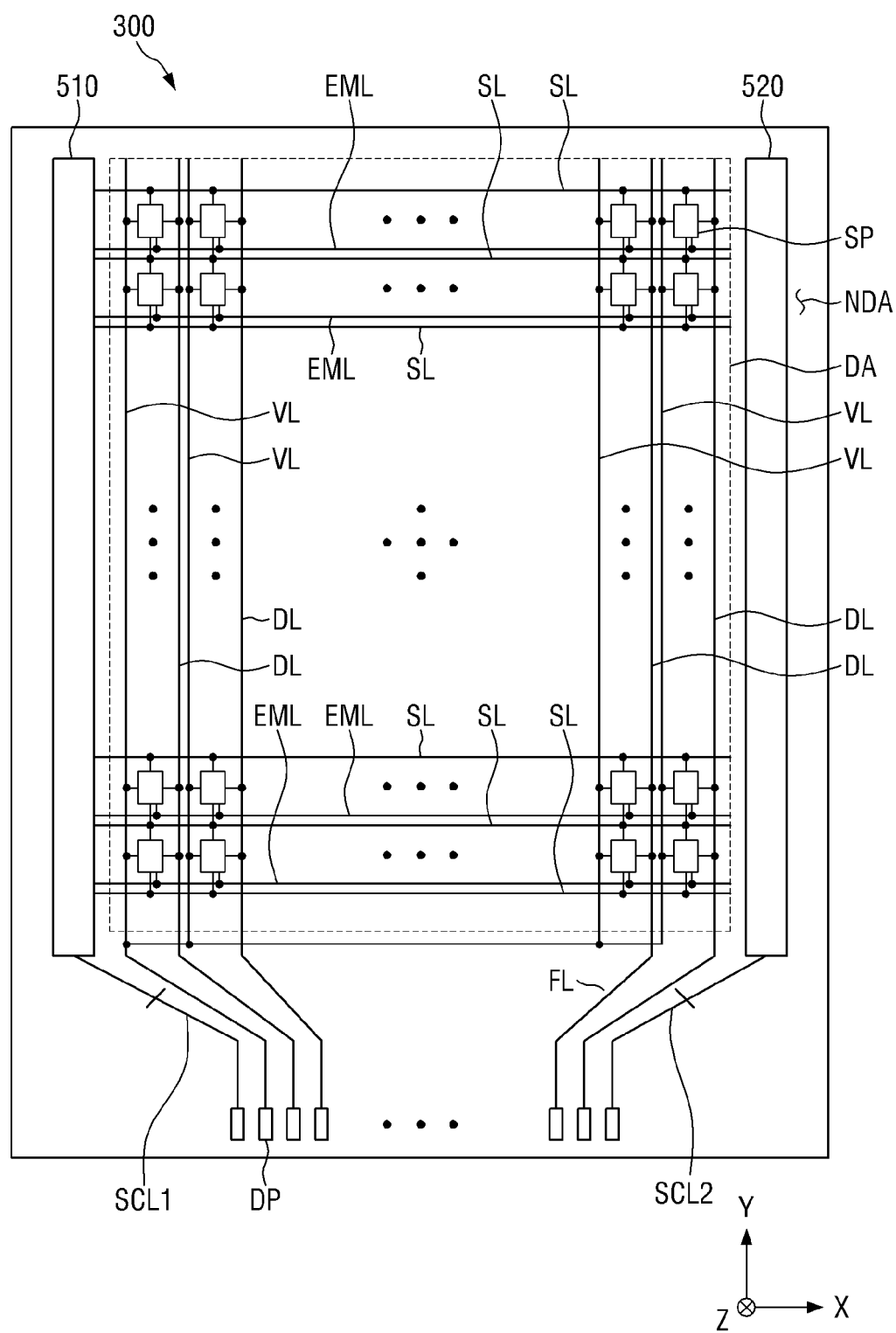
FIG. 3 is a plan view illustrating the display panel of FIG. 2.
Figure 4:
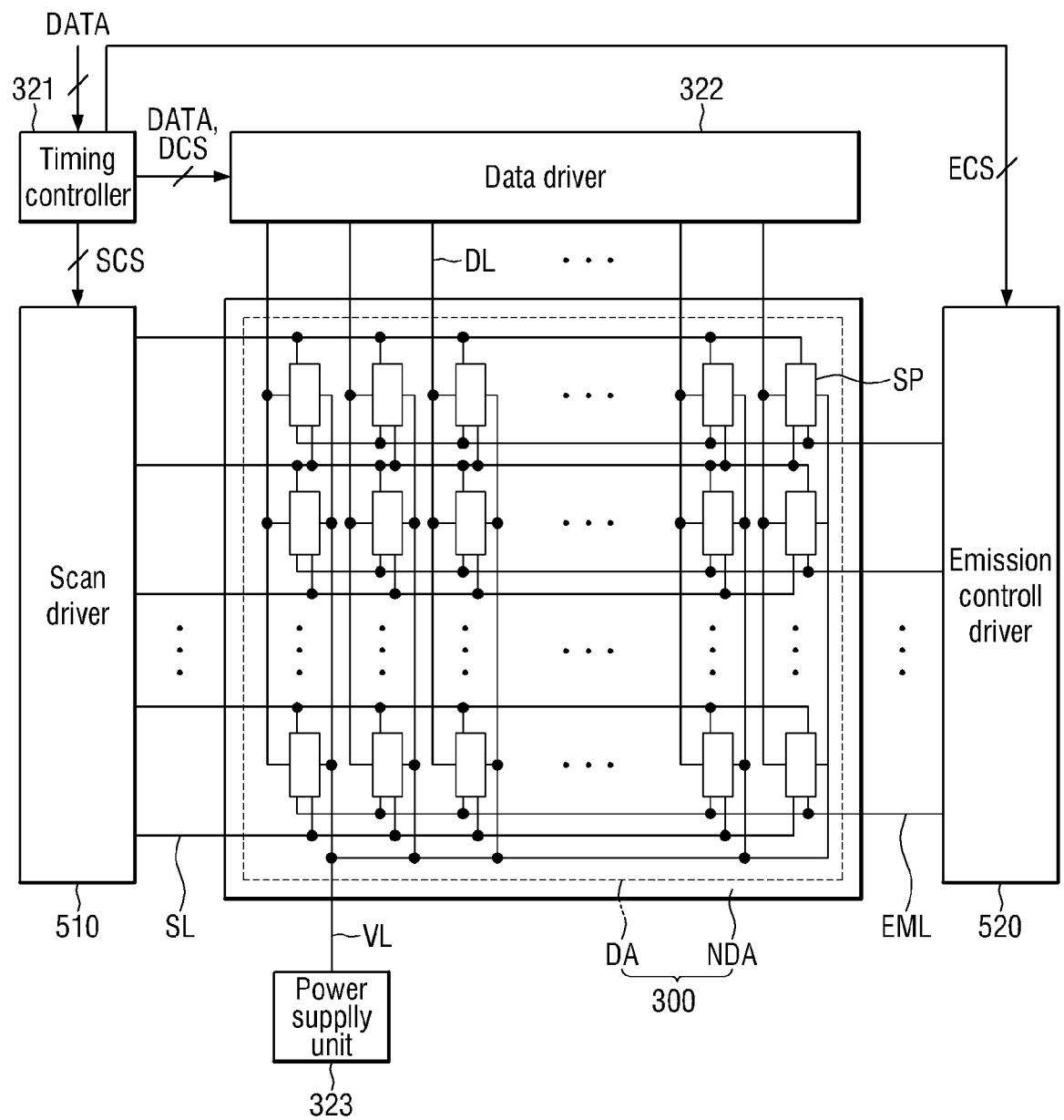
FIG. 4 is a block diagram illustrating the display panel of FIG. 2.

FIG. 3 is a plan view illustrating the display panel of FIG. 2. FIG. 4 is a block diagram illustrating the display panel of FIG. 2.

Referring to FIGS. 3 and 4, the display panel 300 may include a display area DA in which sub-pixels SP may be formed or disposed to display an image, and a non-display area NDA which may be a peripheral area of the display area DA. The display area DA may include the sub-pixels SP, scan lines SL electrically connected to the sub-pixels SP, emission control lines EML, data lines DL, and voltage supply lines VL. The scan lines SL and the emission control lines EML may be formed in parallel in the first direction (X-axis direction). The data lines DL and the voltage supply lines VL may be formed in parallel in the second direction (Y-axis direction) crossing or intersecting the first direction (X-axis direction). The first direction may be substantially perpendicular to the second direction.

Each of the sub-pixels SP may be electrically connected to at least one of the scan lines SL, at least one of the data lines DL, at least one of the emission control lines EML, and at least one of the voltage supply lines VL. In FIG. 3, each of the sub-pixels SP may be electrically connected to two scan lines SL, one data line DL, one emission control line EML, and one voltage supply line VL, but the disclosure is not limited thereto. In an example, each of the sub-pixels SP may be electrically connected to three scan lines SL.

Each of the sub-pixels SP may include a driving transistor, at least one switching transistor, a light emitting element, and at least one capacitor. The switching transistor may be turned on when a scan signal is applied from the scan line SL, and thus a data voltage of the data line DL may be applied to a gate electrode of the driving transistor. The driving transistor may supply a driving current to the light emitting element according to the data voltage applied to the gate electrode, and the light emitting element may emit light having a predetermined luminance according to the magnitude of the driving current. The driving transistor and at least one switching transistor may be thin film transistors. The light emitting element may be an organic light emitting diode including a first electrode, an organic light emitting layer and a second electrode. The capacitor may maintain the data voltage applied to the gate electrode of the driving transistor constant.

The non-display area NDA may be defined as an area from the outside of the display area DA to edges of the display panel 300. The non-display area NDA may include a scan driver 510 that may apply scan signals to the scan lines SL, an emission control driver 520 that may apply emission signals to the emission control lines EML, fan-out lines FL between the data lines DL and pads DP, and the pads DP electrically connected to the display driver 320. For example, the pads DP may be disposed at a side edge of the display panel 300.

The display panel 300 may include the scan driver 510 and the emission control driver 520.

The scan driver 510 may generate scan signals based on a scan control signal SCS and sequentially output the scan signals to the scan lines SL. The emission control driver 520 may generate emission signals according to an emission control signal ECS, and sequentially output the emission signals to the emission control lines EML.

Each of the scan driver 510 and the emission control driver 520 may include thin film transistors. The scan driver 510 and the emission control driver 520 may be formed or disposed on the same layer as the thin film transistors of the sub-pixels SP. In FIG. 3, the scan driver 510 may be disposed on a left side of the non-display area NDA, and the emission control driver 520 may be disposed on a right side of the non-display area NDA, but the disclosure is not limited thereto.

In FIG. 4, the display driver 320 may include a timing controller 321, a data driver 322, and a power supply unit 323.

The timing controller 321 may receive digital video data DATA and timing signals from the display circuit board 310. The timing controller 321 may generate a data control signal DCS that may control an operation timing of the data driver 322 based on the timing signals, generate a scan control signal SCS that may control an operation timing of the scan driver 510, and generate an emission control signal ECS that may control an operation timing of the emission control driver 520. The timing controller 321 may supply the digital video data DATA and the data control signal DCS to the data driver 322. The timing controller 321 may supply the scan control signal SCS to the scan driver 510 through first scan control lines SCL1, and supply the emission control signal ECS to the emission control driver 520 through the second scan control lines SCL2.

The data driver 322 may convert the digital video data DATA into analog positive/negative data voltages and supply them to the data lines DL through the fan-out lines FL. The scan signals of the scan driver 510 may select the sub-pixels SP to be supplied with the data voltages, and the data driver 322 may supply data voltages to the selected sub-pixels SP.

The power supply unit 323 may generate a first driving voltage and supply the first driving voltage to the voltage supply line VL. The power supply unit 323 may generate a second driving voltage and supply the second driving voltage to a cathode electrode of the light emitting element of each of the sub-pixels SP. Here, the first driving voltage may be a high potential voltage that may drive the light emitting element, and the second driving voltage may be a low potential voltage that may drive the light emitting element. For example, the first driving voltage may have a potential that may be higher than the potential of the second driving voltage.

Figure 5:
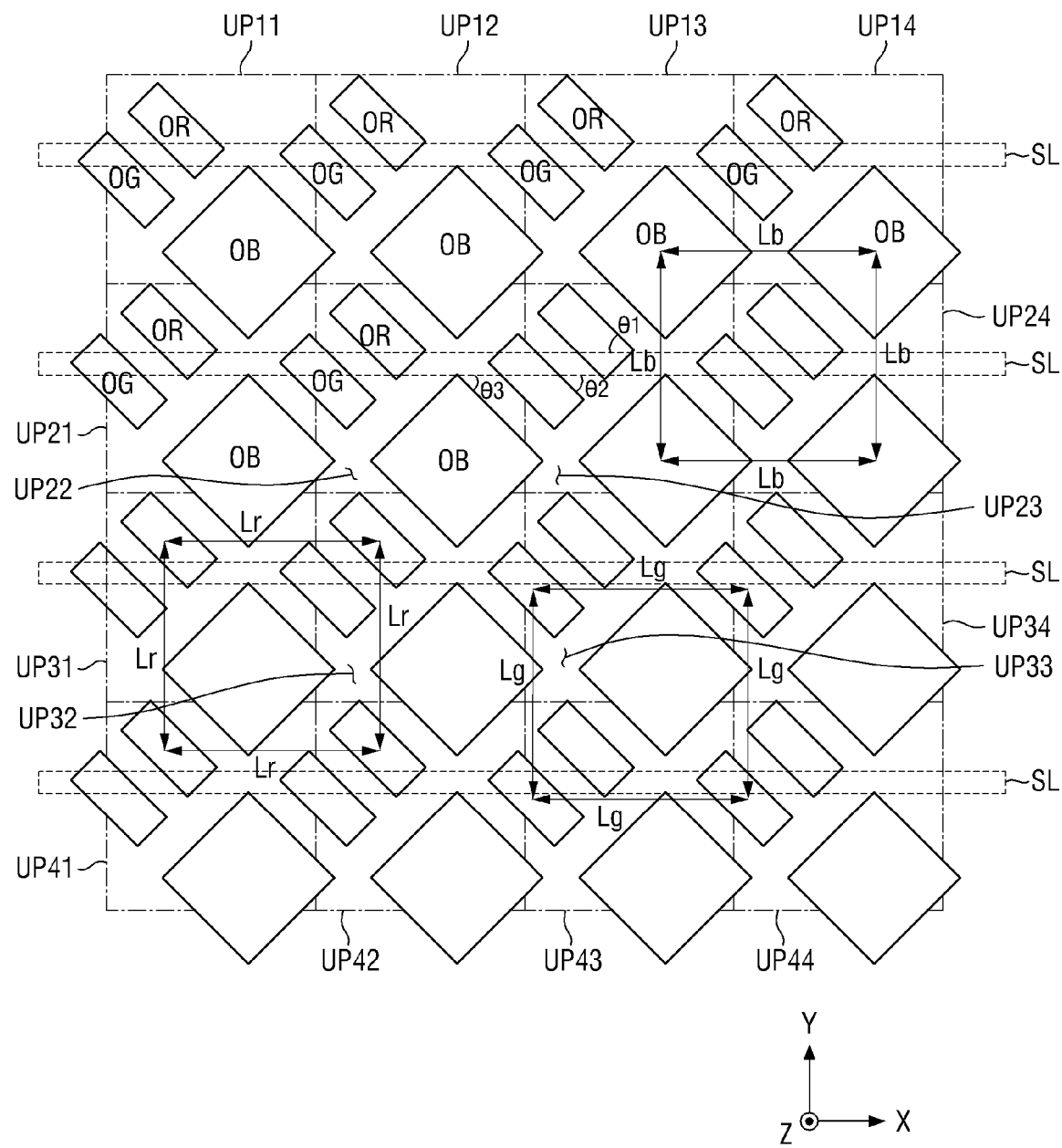
FIG. 5 is a plan view illustrating unit pixel regions of a display device according to an embodiment.

FIG. 5 is a plan view illustrating unit pixel regions of a display device according to an embodiment.

Referring to FIG. 5, the display area DA of the display panel 300 may include unit pixel regions. For example, the unit pixel regions may include a first-first unit pixel region UP11 to a fourth-fourth unit pixel region UP44 disposed in four rows and four columns. The display area DA may include more unit pixel regions as the resolution of the display device 10 increases. Accordingly, the display area DA may include unit pixel regions disposed in p rows and q columns (p and q are natural numbers) according to the resolution of the display device 10.

Each of the first-first unit pixel region UP11 to the fourth-fourth unit pixel region UP44 may include sub-pixels displaying different colors. The sub-pixels may be provided by or disposed at intersections of n data lines DL (n is a natural number) and m scan lines SL (m is a natural number). One unit pixel region may accommodate a pixel circuit of each of the sub-pixels. The pixel circuit may include a driving transistor, at least one switching transistor, and at least one capacitor to drive a light emitting element of each of the sub-pixels.

For example, one unit pixel region may include a red sub-pixel, a green sub-pixel, and a blue sub-pixel. Each of the red sub-pixel, the green sub-pixel, and the blue sub-pixel may receive a data signal including gradation information of red, green, or blue light from the data driver 322 and output light of a corresponding color.

Each of the first-first unit pixel region UP11 to the fourth-fourth unit pixel region UP44 may include first to third sub-pixels. For example, the first sub-pixel may be a red sub-pixel, the second sub-pixel may be a green sub-pixel, and the third sub-pixel may be a blue sub-pixel, but the disclosure is not limited thereto.

The first sub-pixel may include a first opening region OR, the second sub-pixel may include a second opening region OG, and the third sub-pixel may include a third opening region OB. The first to third opening regions OR, OG and OB may be defined by a pixel defining layer. A light emitting layer of each of the first to third sub-pixels may be disposed in each of the first to third opening regions OR, OG and OB to emit light of a specific wavelength band. The size of each of the first to third opening regions OR, OG and OB may be adjusted to realize white light by mixing light emitted from each of light emitting layers. The first to third sub-pixels may have opening regions of different sizes to realize white light. For example, the size of the third opening region OB may be larger than that of the first or second opening region OR or OG, but is not necessarily limited thereto.

The first opening region OR and the second opening region OG of each of the first-first unit pixel region UP11 to the fourth-fourth unit pixel region UP44 may be disposed side by side on the upper left side of the third opening region OB. The first opening region OR may be disposed on the upper right side of the second opening region OG. For example, the first opening region OR may overlap the corresponding unit pixel region to output red light.

A portion of the second opening region OG may overlap the corresponding unit pixel region, and the other portion of the second opening area OG may overlap the unit pixel region adjacent to the left side of the corresponding unit pixel region to output green light. For example, the pixel circuit of the second sub-pixel of the first-second unit pixel region UP12 and a portion of the second opening region OG may be disposed in the first-second unit pixel region UP12, and the other portion of the second opening region OG may overlap the first-first unit pixel region UP11.

A portion of the third opening region OB may overlap the corresponding unit pixel region, another portion of the third opening region OB may overlap the unit pixel region adjacent to the right side of the corresponding unit pixel region, and the remaining portion of the third opening region OB may overlap the unit pixel region adjacent to the lower side of the corresponding unit pixel region to output blue light. For example, the pixel circuit of the third sub-pixel of the first-first unit pixel region UP11 and a portion of the third opening region OB may be disposed in the first-first unit pixel region UP11, another portion of the third opening region OB may be overlap the first-second unit pixel region UP12, and the remaining portion of the third opening region OB may overlap the second-first unit pixel region UP21.

As described above, a portion of the opening region of at least one sub-pixel of the first to third sub-pixels may overlap the unit pixel region adjacent to the corresponding unit pixel region. A portion of at least one opening region of the opening regions OR, OG and OB of the sub-pixel may overlap the adjacent unit pixel region beyond the corresponding unit pixel region. Therefore, the display device 10 may improve the image quality of the display device 10 by maximizing an aperture ratio of the unit pixel region.

The first and second opening regions OR and OG may be disposed between extension lines of both sides of the third opening region OB. For example, the first and second opening regions OR and OG may be disposed side by side between the extension lines of the lower left side and the upper right side of the third opening region OB. The long sides of each of the first and second opening regions OR and OG may be parallel to the extension lines of the lower left side and the upper right side of the third opening region OB. One side of the third opening region OB may face the short sides of each of the first and second opening regions OR and OG.

For example, the third opening region OB may have a substantially square shape, and the first and second opening regions OR and OG may have a substantially rectangular shape substantially smaller than the third opening region OB, but they are not necessarily limited thereto.

A distance Lr between the center of gravity of the first opening region OR of the third-first unit pixel region UP31 and the center of gravity of the first opening region OR of the third-second unit pixel region UP32 may be substantially equal to a distance Lr between the center of gravity of the first opening region OR of the third-first unit pixel region UP31 and the center of gravity of the first opening region OR of the fourth-first unit pixel region UP41 (Lr=Lr). A distance Lr between the center of gravity of the first opening region OR of the third-first unit pixel region UP31 and the center of gravity of the first opening region OR of the third-second unit pixel region UP32 may be substantially equal to a distance Lr between the center of gravity of the first opening region OR of the third-second unit pixel region UP32 and the center of gravity of the first opening region OR of the fourth-second unit pixel region UP42 (Lr=Lr). Accordingly, the first opening regions OR of the first-first unit pixel region UP11 to the fourth-fourth unit pixel region UP44 may be disposed at uniform intervals, thereby achieving uniform image quality.

A distance Lg between the center of gravity of the second opening region OG of the third-third unit pixel region UP33 and the center of gravity of the second opening region OG of the third-fourth unit pixel region UP34 may be substantially equal to a distance Lg between the center of gravity of the second opening region OG of the third-third unit pixel region UP33 and the center of gravity of the second opening region OG of the fourth-third unit pixel region UP43 (Lg=Lg). Accordingly, the second opening regions OG of the first-first unit pixel region UP11 to the fourth-fourth unit pixel region UP44 may be disposed at uniform intervals, thereby achieving uniform image quality.

A distance Lb between the center of gravity of the third opening region OB of the first-third unit pixel region UP13 and the center of gravity of the third opening region OB of the first-fourth unit pixel region UP14 may be substantially equal to a distance Lb between the center of gravity of the third opening region OB of the first-third unit pixel region UP13 and the center of gravity of the third opening region OB of the second-third unit pixel region UP23 (Lb=Lb). Accordingly, the third opening regions OB of the first-first unit pixel region UP11 to the fourth-fourth unit pixel region UP44 may be disposed at uniform intervals, thereby achieving uniform image quality.

One side of the opening region OR, OG, OB of at least one sub-pixel of the first to third sub-pixels may cross or intersect the scan line SL at a predetermined angle. The first opening region OR and the scan line SL may cross or intersect each other at a first angle θ1 (not horizontal or vertical), the second opening region OG and the scan line SL may cross or intersect each other at a second angle θ2, and the third opening region OB and the scan line SL may cross or intersect each other at a third angle θ3. For example, an on-plane angle (for example, θ1, θ2 or θ3) between one side of at least one opening region of the first to third opening regions OR, OG and OB and the scan line SL may be about 45 degrees. The long sides and the short sides of the first opening region OR and the second opening region OG may cross or intersect the scan line SL at an angle of about 45 degrees, and one side of the third opening region OB may cross or intersect the scan line SL at an angle of about 45 degrees.

As described above, one side of the opening region OR, OG, OB of each of the sub-pixels and the scan line SL may cross or intersect each other in a plan view. For example, one side of the opening region OR, OG, OB of each of the sub-pixels may not be parallel to the scan line SL in a plan view, and may not cross or intersect the scan line SL at a right angle in a plan view. Thus, the display device 10 may minimize external light reflected at the boundary of the opening regions OR, OG and OB (for example, between the pixel defining layer and the opening region).

Figure 6:
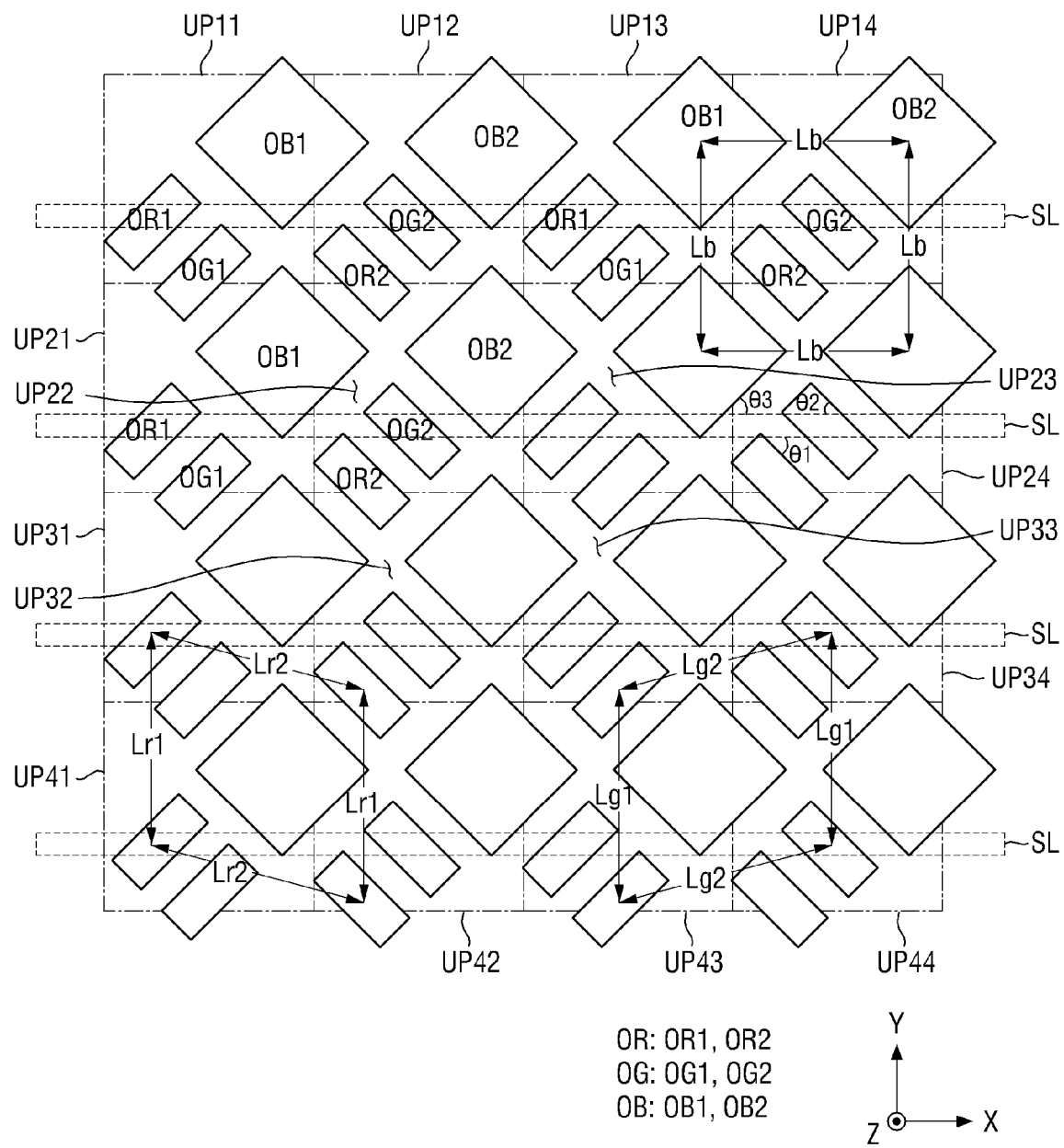
FIG. 6 is a plan view illustrating unit pixel regions of a display device according to an embodiment.

FIG. 6 is a plan view illustrating unit pixel regions of a display device according to an embodiment. The unit pixel regions of FIG. 6 may be different from the unit pixel regions of FIG. 5 in the arrangement of the first to third opening regions OR, OG and OB. The same configuration as the above-described configuration will be briefly described or omitted.

Referring to FIG. 6, the first opening region OR1, OR2 and the second opening region OG1, OG2 of each of the first-first unit pixel region UP11 to the fourth-fourth unit pixel region UP44 may be disposed side by side on the lower left side of the third opening region OB1, OB2. The first opening region OR1 of the first-first unit pixel region UP11 may be disposed on the upper left side of the second opening region OG1 of the first-first unit pixel region UP11, and the first opening region OR2 of the first-second unit pixel region UP12 may be disposed on the lower left side of the second opening region OG2 of the first-second unit pixel region UP12. The first to third opening regions OR, OG and OB may be regularly arranged by grouping two adjacent unit pixel regions into one group.

The first opening region OR1 of the first-first unit pixel region UP11 may be disposed in the first-first unit pixel region UP11 to output red light. The pixel circuit of the first sub-pixel of the first-second unit pixel region UP12 and a portion of the first opening region OR2 may be disposed in the first-second unit pixel region UP12, and the other portion of the first opening region OR2 may overlap the second-second unit pixel region UP22.

The pixel circuit of the second sub-pixel of the first-first unit pixel region UP11 and a portion of the second opening region OG1 may be disposed in the first-first unit pixel region UP11, and the other portion of the second opening region OG1 may overlap the second-first unit pixel region UP21. The second opening region OG2 of the first-second unit pixel region UP12 may be disposed in the first-second unit pixel region UP12 to output green light.

The pixel circuit of the third sub-pixel of the second-first unit pixel region UP21 and a portion of the third opening region OB may be disposed in the second-first unit pixel region UP21, another portion of the third opening region OB may overlap the first-first unit pixel region UP11, and the remaining portion of the third opening region OB may overlap the second-second unit pixel region UP22.

As described above, a portion of the opening region of at least one sub-pixel of the first to third sub-pixels may overlap the unit pixel region adjacent to the corresponding unit pixel region. A portion of at least one opening region of the opening regions OR, OG and OB of the sub-pixel may overlap the adjacent unit pixel region beyond the corresponding unit pixel region. Therefore, the display device 10 may improve the image quality of the display device 10 by maximizing an aperture ratio of the unit pixel region.

The first and second opening regions OR1 and OG1 of the first-first unit pixel region UP11 may be disposed between extension lines of both sides of the third opening region OB1. For example, the first and second opening regions OR1 and OG1 may be disposed side by side between the extension lines of the upper left side and the lower right side of the third opening region OB1. The long sides of each of the first and second opening regions OR1 and OG1 may be parallel to the extension lines of the upper left side and the lower right side of the third opening region OB1. One side of the third opening region OB1 may face the short sides of each of the first and second opening regions OR1 and OG1.

The first and second opening regions OR2 and OG2 of the first-second unit pixel region UP12 may be disposed between extension lines of both sides of the third opening region OB2. For example, the first and second opening regions OR2 and OG2 may be disposed side by side between the extension lines of the upper left side and the lower right side of the third opening region OB2. The long sides of each of the first and second opening regions OR1 and OG1 may be parallel to the extension lines of the lower left side and the upper right side of the third opening region OB1.

For example, the third opening regions OB1 and OB2 may have a substantially square shape, and the first and second opening regions OR1, OR2, OG1 and OG2 may have a substantially rectangular shape substantially smaller than the third opening regions OB1 and OB2, but they are not necessarily limited thereto.

A distance Lr2 between the center of gravity of the first opening region OR1 of the third-first unit pixel region UP31 and the center of gravity of the first opening region OR2 of the third-second unit pixel region UP32 may be greater than a distance Lr1 between the center of gravity of the first opening region OR1 of the third-first unit pixel region UP31 and the center of gravity of the first opening region OR1 of the fourth-first unit pixel region UP41 (Lr2>Lr1).

The first opening regions OR1 and OR2 may be regularly arranged by grouping two adjacent unit pixel regions into one group. For example, a distance between the center of gravity of the first opening region OR1 of the first-first unit pixel region UP11 and the center of gravity of the first opening region OR1 of the first-third unit pixel region UP13 may be equal to a distance between the center of gravity of the first opening region OR1 of the first-first unit pixel region UP11 and the center of gravity of the first opening region OR1 of the third-first unit pixel region UP31. Therefore, the first opening regions OR1 and OR2 of the first-first unit pixel region UP11 to the fourth-fourth unit pixel region UP44 may be regularly arranged by grouping two adjacent unit pixel regions into one group, thereby achieving uniform image quality.

A distance Lg2 between the center of gravity of the second opening region OG1 of the third-third unit pixel region UP33 and the center of gravity of the second opening region OG2 of the third-fourth unit pixel region UP34 may be greater than a distance Lg1 between the center of gravity of the second opening region OG1 of the third-third unit pixel region UP33 and the center of gravity of the second opening region OG1 of the fourth-third unit pixel region UP43 (Lg2>Lg1).

The second opening regions OG1 and OG2 may be regularly arranged by grouping two adjacent unit pixel regions into one group. For example, a distance between the center of gravity of the second opening region OG1 of the first-first unit pixel region UP11 and the center of gravity of the second opening region OG1 of the first-third unit pixel region UP13 may be equal to a distance between the center of gravity of the second opening region OG1 of the first-first unit pixel region UP11 and the center of gravity of the second opening region OG1 of the third-first unit pixel region UP31. Therefore, the second opening regions OG1 and OG2 of the first-first unit pixel region UP11 to the fourth-fourth unit pixel region UP44 may be regularly arranged by grouping two adjacent unit pixel regions into one group, thereby achieving uniform image quality.

A distance Lb between the center of gravity of the third opening region OB1 of the first-third unit pixel region UP13 and the center of gravity of the third opening region OB2 of the first-fourth unit pixel region UP14 may be equal to a distance Lb between the center of gravity of the third opening region OB1 of the first-third unit pixel region UP13 and the center of gravity of the third opening region OB1 of the second-third unit pixel region UP23 (Lb=Lb). Accordingly, the third opening regions OB1 and OB2 of the first-first unit pixel region UP11 to the fourth-fourth unit pixel region UP44 may be disposed at uniform intervals, thereby achieving uniform image quality.

One side of the opening region OR, OG, OB of at least one sub-pixel of the first to third sub-pixels may cross or intersect the scan line SL at a predetermined angle. The first opening region OR and the scan line SL may cross or intersect each other at a first angle $\theta 1$ (not horizontal or vertical), the second opening region OG and the scan line SL may cross or intersect each other at a second angle $\theta 2$, and the third opening region OB and the scan line SL may cross or intersect each other at a third angle $\theta 3$. For example, an on-plane angle (for example, $\theta 1$, $\theta 2$ or $\theta 3$) between one side of at least one opening region of the first to third opening regions OR, OG and OB and the scan line SL may be about 45 degrees. The long sides and the short sides of the first opening region OR and the second opening region OG may cross or intersect the scan line SL at an angle of about 45 degrees, and one side of the third opening region OB may cross or intersect the scan line SL at an angle of about 45 degrees.

As described above, one side of the opening region OR, OG, OB of each of the sub-pixels and the scan line SL may cross or intersect each other in a plan view. For example, one side of the opening region OR, OG, OB of each of the sub-pixels may not be parallel to the scan line SL in a plan view, and may not cross or intersect the scan line SL at a right angle in a plan view. Thus, the display device 10 may minimize external light reflected at the boundary of the opening regions OR, OG and OB (for example, between the pixel defining layer and the opening region).

Figure 7:
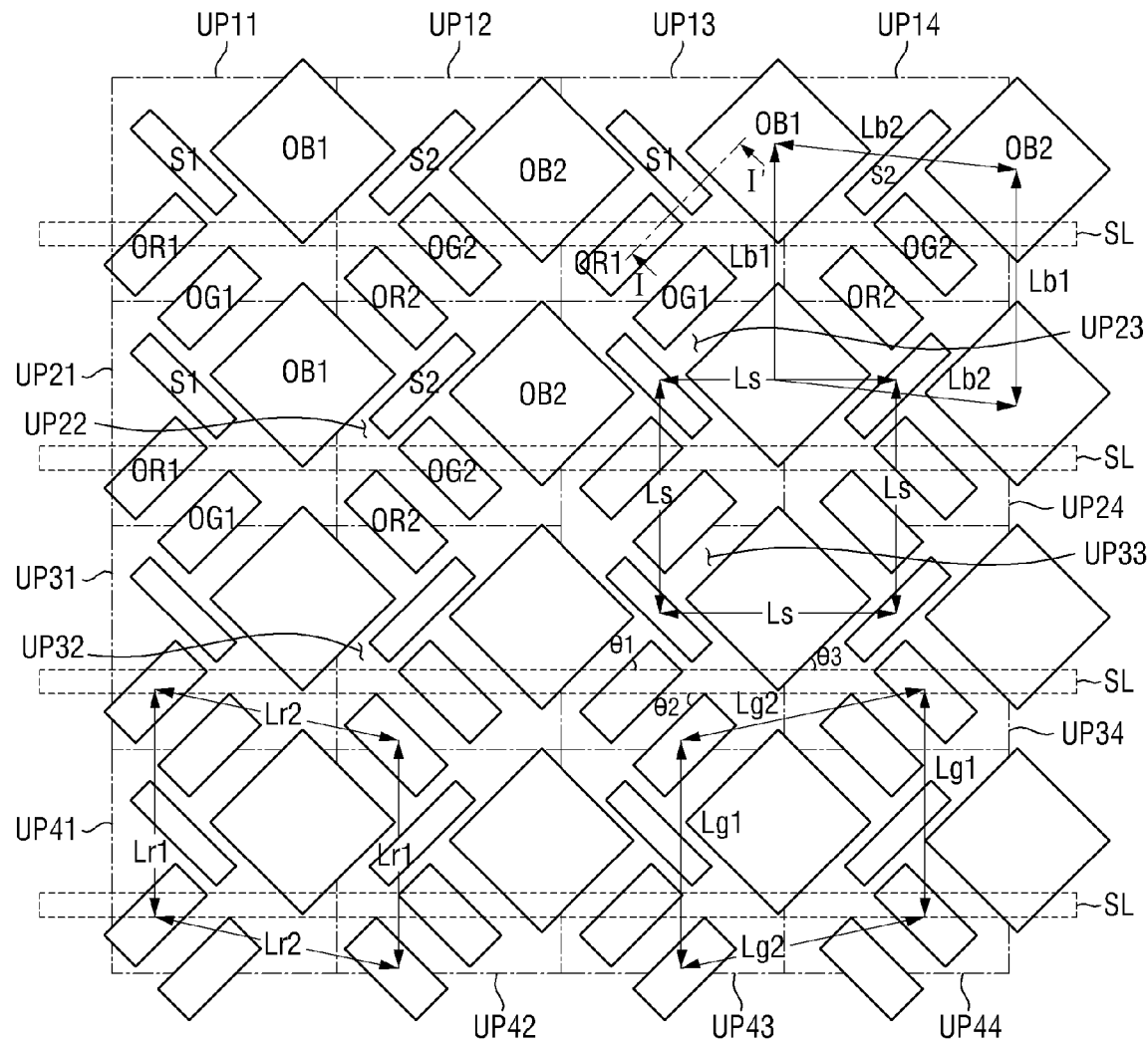
FIG. 7 is a plan view illustrating unit pixel regions of a display device according to an embodiment.
Figure 7:
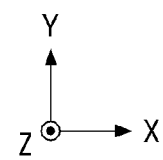

FIG. 7 is a plan view illustrating unit pixel regions of a display device according to an embodiment. The unit pixel regions of FIG. 7 may include first and second spacers S1 and S2 in the unit pixel regions of FIG. 6. The same configuration as the above-described configuration will be briefly described or omitted.

Referring to FIG. 7, each of the first-first unit pixel region UP11 to the fourth-fourth unit pixel region UP44 may include first to third sub-pixels.

Each of the first sub-pixel of the first-first unit pixel region UP11 and first sub-pixel of the first-third unit pixel region UP13 may include the first opening region OR1, the second sub-pixel may include the second opening region OG1, and the third sub-pixel may include the third opening region OB1.

Each of the first sub-pixel of the first-second unit pixel region UP12 and first sub-pixel of the first-fourth unit pixel region UP14 may include the first opening region OR2, the second sub-pixel may include the second opening region OG2, and the third sub-pixel may include the third opening region OB2.

The first to third opening regions OR1, OG1 and OB1 of the first-first unit pixel region UP11 and first to third opening regions OR2, OG2 and OB2 of the first-second unit pixel region UP12 may be disposed in the same or similar manner as the first to third opening regions OR1, OR2, OG1, OG2, OB1 and OB2 illustrated in FIG. 6.

A distance Lb2 between the center of gravity of the first opening region OB1 of the first-third unit pixel region UP13 and the center of gravity of the first opening region OB2 of the first-fourth unit pixel region UP14 may be greater than a distance Lb1 between the center of gravity of the first opening region OB1 of the first-third unit pixel region UP13 and the center of gravity of the first opening region OB1 of the second-third unit pixel region UP23 (Lb2>Lb1).

The first-first unit pixel region UP11 may include a first spacer S1. The first spacer S1 may be disposed between the first opening region OR1 and the third opening region OB1. For example, an end of the first spacer S1 may be disposed between the first opening region OR1 and the third opening region OB1, and another end of the first spacer S1 may extend from one end toward the upper left side.

The long side direction of the first spacer S1 may be substantially perpendicular to the long side direction of the first opening region OR1 or the second opening region OG1. The first spacer S1 may alleviate the shock transmitted to the first-first unit pixel region UP11 and improve the durability of the first-first unit pixel region UP11.

The first-second unit pixel region UP12 may include a second spacer S2. The second spacer S2 may be disposed on the upper left side of the second opening region OG2 and the third opening region OB2. For example, an end of the second spacer S2 may be disposed on the upper left side of the second opening region OG2, and another end of the second spacer S2 may be disposed on the upper left side of the third opening region OB2. One end of the second spacer S2 may be disposed between the second opening region OG2 of the first-second unit pixel region UP12 and the third opening region OB1 of the first-first unit pixel region UP11.

The long side direction of the second spacer S2 may be substantially perpendicular to the long side direction of the first opening region OR2 or the second opening region OG2. The long side direction of the second spacer S2 may be substantially perpendicular to the long side direction of the first spacer S1. The second spacer S2 may alleviate the shock transferred to the first-second unit pixel region UP12 and improve the durability of the first-second unit pixel region UP12.

A distance Ls between the center of gravity of the first spacer S1 of the second-third unit pixel region UP23 and the center of gravity of the second spacer S2 of the second-fourth unit pixel region UP24 may be equal to a distance Ls between the center of gravity of the first spacer S1 of the second-third unit pixel region UP23 and the center of gravity of the first spacer S1 of the third-third unit pixel region UP33 (Ls=Ls). The first and second spacers S1 and S2 may be regularly arranged by grouping two adjacent unit pixel regions into one group. Therefore, the first or second spacer S1 or S2 of each of the first-first unit pixel region UP11 to the fourth-fourth unit pixel region UP44 may stably support the first-first unit pixel region UP11 to the fourth-fourth unit pixel region UP44, thereby improving the durability of the display device 10.

The long sides of the first and second spacers S1 and S2 may cross or intersect the scan line SL at a predetermined angle (not horizontal or vertical). The on-plane angle between the long sides of the first or second spacer S1 or S2 and the scan line SL may be about 45 degrees.

As described above, one side of the opening region OR, OG, OB of each of the unit pixel regions and the scan line SL may cross or intersect each other in a plan view. The first or second spacer S1 or S2 of each of the unit pixel regions may cross or intersect the scan line SL in a plan view. Accordingly, the first and second spacers S1 and S2 can improve the durability and reliability of the display device 10 without reducing the aperture ratios of the first to third opening regions OR, OG and OB.

It is to be noted that the above description includes a third direction and a fourth direction in addition to the first and second directions. For example, a side of an opening region of at least one sub-pixel of the sub-pixels may extend in a third direction inclined with respect to each of the first direction and the second direction. A fourth direction may be substantially perpendicular to the third direction.

Figure 8:
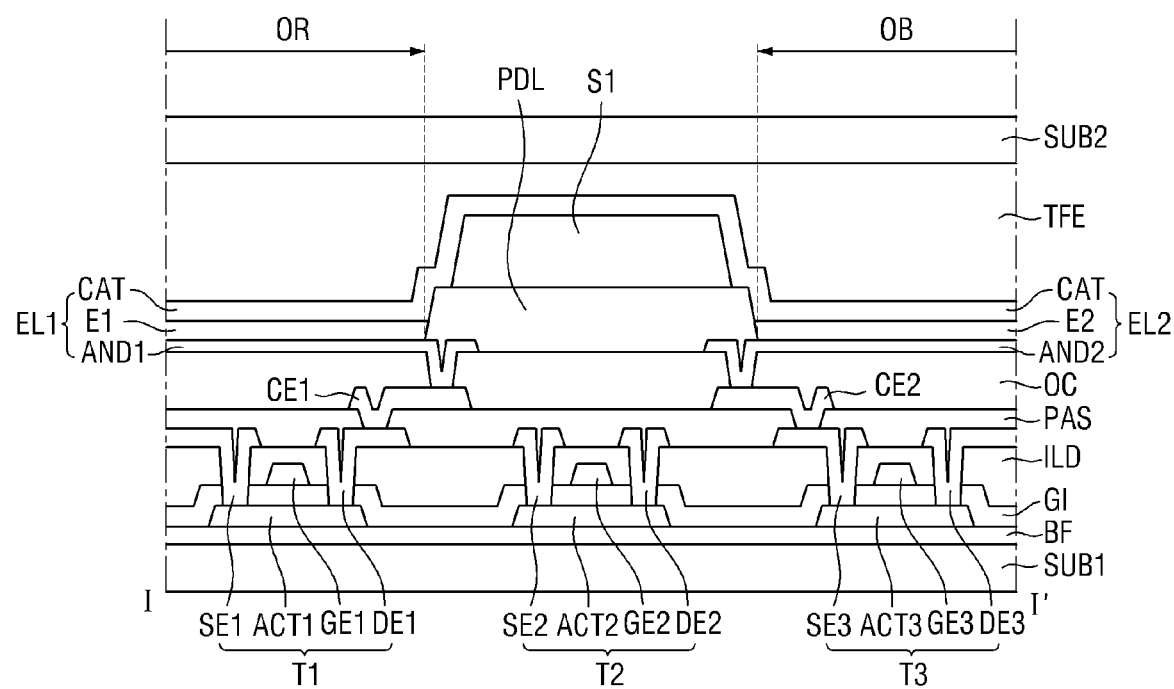
FIG. 8 is a schematic cross-sectional view taken along line I-I' of FIG. 7.

FIG. 8 is a schematic cross-sectional view taken along line I-I' of FIG. 7.

Referring to FIG. 8, the display panel 300 may include a first substrate SUB1, a buffer layer BF, first to third transistors T1, T2 and T3, a gate insulating layer GI, an interlayer insulating layer ILD, a passivation layer PAS, first and second connection electrodes CE1 and CE2, a planarization layer OC, first and second light emitting elements EL1 and EL2, a pixel defining layer PDL, a first spacer S1, an encapsulation layer TFE, and a second substrate SUB2.

The first substrate SUB1 may be a base substrate, and may be made of an insulating material such as polymer resin. For example, the first substrate SUB1 may be a rigid substrate. In an example, the first substrate SUB1 may be a flexible substrate which may be bent, folded or rolled. In a case that the first substrate SUB1 is a flexible substrate, the first substrate SUB1 may be formed of polyimide (PI), but is not necessarily limited thereto.

The buffer layer BF may be disposed on the first substrate SUB1. The buffer layer BF may be formed of an inorganic layer that may prevent infiltration of air or moisture. For example, the buffer layer BF may include inorganic layers that may be alternately stacked. The buffer layer BF may be formed of multiple layers in which one or more inorganic layers of a silicon nitride layer, a silicon oxynitride layer, a silicon oxide layer, a titanium oxide layer and an aluminum oxide layer may be alternately stacked, but is not necessarily limited thereto.

The first transistor T1 may be disposed on the buffer layer BF and may constitute the pixel circuit of the first sub-pixel. For example, the first transistor T1 may be a driving transistor or a switching transistor of the first sub-pixel. The first transistor T1 may include a semiconductor layer ACT1, a gate electrode GE1, a source electrode SE1, and a drain electrode DE1.

The semiconductor layer ACT1 may be provided or disposed on the buffer layer BF. The semiconductor layer ACT1 may overlap the gate electrode GE1, the source electrode SE1, and the drain electrode DE1. The semiconductor layer ACT1 may be in direct contact with the source electrode SE1 and the drain electrode DE1, and may face the gate electrode GE1 with the gate insulating layer GI interposed therebetween.

The gate electrode GE1 may be disposed on the gate insulating layer GI. The gate electrode GE1 may overlap the semiconductor layer ACT1 with the gate insulating layer GI interposed therebetween.

The source electrode SE1 and the drain electrode DE1 may be spaced apart from each other on the interlayer insulating layer ILD. The source electrode SE1 may be in contact with an end of the semiconductor layer ACT1 through a contact hole provided or disposed in the gate insulating layer GI and the interlayer insulating layer ILD. The drain electrode DE1 may be in contact with the other end of the semiconductor layer ACT1 through a contact hole provided or disposed in the gate insulating layer GI and the interlayer insulating layer ILD. The drain electrode DE1 may be electrically connected to an anode electrode AND1 of the first light emitting element EL1 through the first connection electrode CE1.

The second transistor T2 may be disposed on the buffer layer BF and may constitute the pixel circuit of the second sub-pixel. For example, the second transistor T2 may be a driving transistor or a switching transistor of the second sub-pixel. The second transistor T2 may include a semiconductor layer ACT2, a gate electrode GE2, a source electrode SE2, and a drain electrode DE2.

The third transistor T3 may be disposed on the buffer layer BF and may constitute the pixel circuit of the third sub-pixel. For example, the third transistor T3 may be a driving transistor or a switching transistor of the third sub-pixel. The third transistor T3 may include a semiconductor layer ACT3, a gate electrode GE3, a source electrode SE3, and a drain electrode DE3. The drain electrode DE3 of the third transistor T3 may be electrically connected to an anode electrode AND2 of the second light emitting element EL2 through the second connection electrode CE2.

The gate insulating layer GI may be provided or disposed on the semiconductor layers ACT1, ACT2 and ACT3. For example, the gate insulating layer GI may be disposed on the semiconductor layers ACT1, ACT2 and ACT3 and the buffer layer BF, and may insulate the semiconductor layers ACT1, ACT2 and ACT3 from the gate electrodes GE1, GE2 and GE3. The gate insulating layer GI may include contact holes through which the source electrodes SE1, SE2 and SE3 may pass, and contact holes through which the drain electrodes DE1, DE2, and DE3 may pass.

The interlayer insulating layer ILD may be disposed on the gate electrodes GE1, GE2 and GE3. For example, the interlayer insulating layer ILD may include contact holes through which the source electrodes SE1, SE2 and SE3 may pass, and contact holes through which the drain electrodes DE1, DE2, and DE3 may pass through. The contact holes of the interlayer insulating layer ILD may be electrically connected to the contact holes of the gate insulating layer GI.

The passivation layer PAS may be provided or disposed on the first to third transistors T1, T2 and T3 to protect the first to third transistors T1, T2 and T3. For example, the passivation layer PAS may include contact holes through which the first and second connection electrodes CE1 and CE2 may pass.

The planarization layer OC may be provided or disposed on the passivation layer PAS to planarize the upper ends of the first to third transistors T1, T2 and T3. For example, the planarization layer OC may include contact holes through which the anode electrodes AND1 and AND2 of the first and second light emitting elements EL1 and EL2 may pass.

The first light emitting element EL1 may be provided or disposed on the first transistor T1. The first light emitting element EL1 may include an anode electrode AND1, a light emitting layer E1, and a cathode electrode CAT.

The anode electrode AND1 may be provided or disposed on the planarization layer OC. For example, the anode electrode AND1 may be disposed to overlap the first opening region OR defined by the pixel defining layer PDL. The anode electrode AND1 may be electrically connected to the drain electrode DE1 of the first transistor T1 through the first connection electrode CE1.

The light emitting layer E1 may be provided or disposed on the anode electrode AND1. The light emitting layer E1 may include a hole injection layer, a hole transport layer, a light receiving layer, an electron blocking layer, an electron transport layer, an electron injection layer, and the like within the spirit and the scope of the disclosure. For example, the light emitting layer E1 may be an organic light emitting layer made of an organic material, but is not necessarily limited thereto. In a case where the light emitting layer E1 is an organic light emitting layer, when the first transistor T1 applies a predetermined voltage to the anode electrode AND1 of the first light emitting element EL1 and the cathode electrode CAT of the first light emitting element EL1 receives a common voltage or a cathode voltage, each of the holes and the electrons may move to the organic light emitting layer E1 through the hole transport layer and the electron transport layer, and the holes and the electrons may combine with each other in the organic light emitting layer E1 to emit light.

The cathode electrode CAT may be provided or disposed on the light emitting layer E1. For example, the cathode electrode CAT may be implemented as an electrode common to all of the sub-pixels SP without distinction for each sub-pixel SP. In FIGS. 7 and 8, the cathode electrode CAT may be disposed on the light emitting layers E1 and E2 in the opening regions OR, OG and OB, and may be disposed on the pixel defining layer PDL or the spacers S1 and S2 in a non-opening region.

The second light emitting element EL2 may be provided or disposed on the third transistor T3. The second light emitting element EL2 may include an anode electrode AND2, a light emitting layer E2, and a cathode electrode CAT.

The anode electrode AND2 may be provided or disposed on the planarization layer OC. For example, the anode electrode AND2 may be disposed to overlap the third opening region OB defined by the pixel defining layer PDL. The anode electrode AND2 may be electrically connected to the drain electrode DE3 of the third transistor T3 through the second connection electrode CE2. The light emitting layer E2 may be provided or disposed on the anode electrode AND2, and the cathode electrode CAT may be provided or disposed on the light emitting layer E2.

The pixel defining layer PDL may define the first to third opening regions OR, OG and OB. The pixel defining layer PDL may separate and insulate the anode electrodes AND1 and AND2 of the first and second light emitting elements EL1 and EL2, respectively.

For example, the pixel defining layer PDL may include a light absorbing material such as a black pigment or a black dye that may absorb light. The pixel defining layer PDL may include a light absorbing material, thereby minimizing external light reflected at the boundary of the opening region.

The first spacer S1 may be disposed on the pixel defining layer PDL. The first spacer S1 may maintain a constant distance between the first substrate SUB1 and the second substrate SUB2. The first spacer S1 may alleviate the shock transmission between the first substrate SUB1 and the second substrate SUB2. For example, the first spacer S1 may include a material having excellent shock absorbency and flexibility to improve the durability of the display device 10.

The encapsulation layer TFE may be disposed on the cathode electrode CAT to cover or overlap the first to third transistors T1, T2 and T3 and the first and second light emitting elements EL1 and EL2. The encapsulation layer TFE may prevent oxygen or moisture from infiltrating into the first and second light emitting elements EL1 and EL2.

The second substrate SUB2 may be disposed on the encapsulation layer TFE to face the first substrate SUB1. The second substrate SUB2 may block the first to third transistors T1, T2 and T3 and the first and second light emitting elements EL1 and EL2 from external moisture, air and the like within the spirit and the scope of the disclosure. The second substrate SUB2 may be supported by the first spacer S1. For example, the second substrate SUB2 may be a rigid substrate. In an example, the second substrate SUB2 may be a flexible substrate which may be bent, folded or rolled. In a case that the second substrate SUB2 is a flexible substrate, the second substrate SUB2 may be formed of polyimide (PI), but is not necessarily limited thereto.

Figure 9:
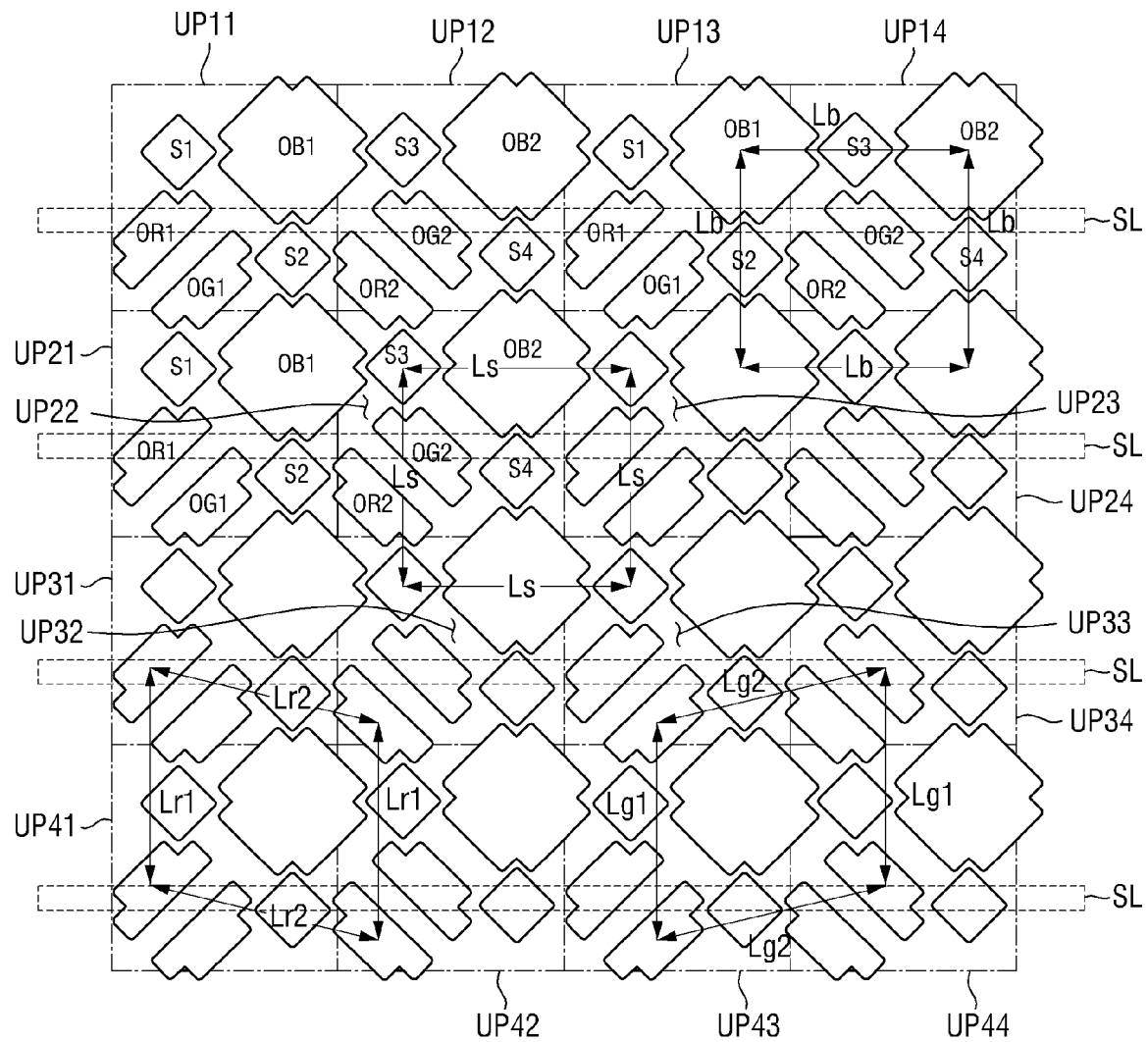
FIG. 9 is a plan view illustrating unit pixel regions of a display device according to an embodiment.
Figure 10:
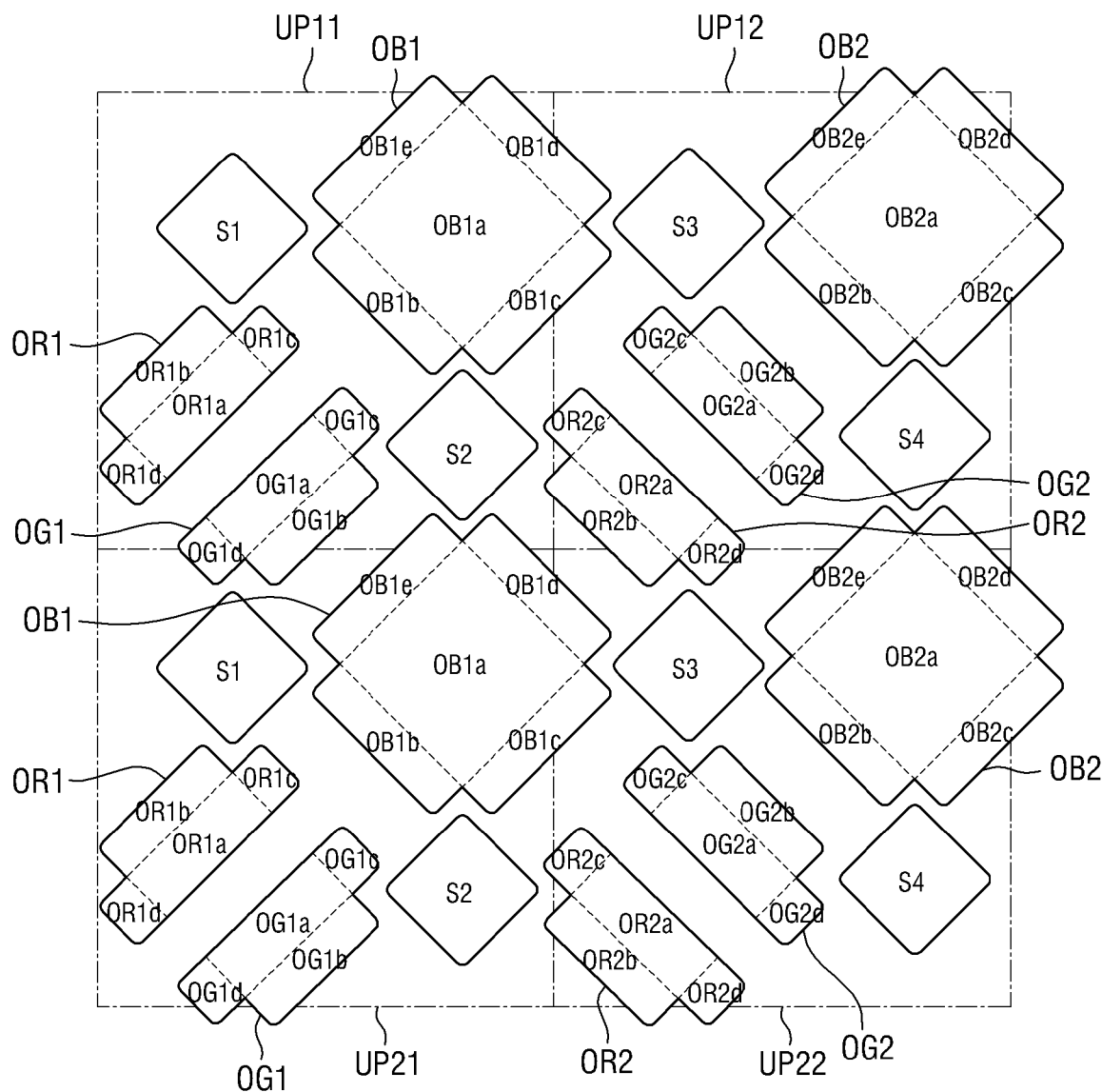
FIG. 10 is an enlarged view of the unit pixel regions of FIG. 9.

FIG. 9 is a plan view illustrating unit pixel regions of a display device according to an embodiment. FIG. 10 is an enlarged view of the unit pixel regions of FIG. 9.

Referring to FIGS. 9 and 10, the first opening region OR1, OR2 and the second opening region OG1, OG2 of each of the first-first unit pixel region UP11 to the fourth-fourth unit pixel region UP44 may be disposed side by side on the lower left side of the third opening region OB1, OB2. The first opening region OR1 of the first-first unit pixel region UP11 may be disposed on the upper left side of the second opening region OG1 of the first-first unit pixel region UP11, and the first opening region OR2 of the first-second unit pixel region UP12 may be disposed on the lower left side of the second opening region OG2 of the first-second unit pixel region UP12. The first to third opening regions OR, OG and OB may be regularly arranged by grouping two adjacent unit pixel regions into one group.

The first opening region OR1 of the first-first unit pixel region UP11 may be disposed in the first-first unit pixel region UP11 to output red light. The pixel circuit of the first sub-pixel of the first-second unit pixel region UP12 and a portion of the first opening region OR2 may be disposed in the first-second unit pixel region UP12, another portion of the first opening region OR2 may overlap the first-first unit pixel region UP11, and the remaining portion of the first opening region OR2 may overlap the second-second unit pixel region UP22.

The first opening region OR1 of the first-first unit pixel region UP11 may include a central portion OR1*a* and first to third protrusions OR1*b*, OR1*c* and OR1*d*. The first protrusion OR1*b* may protrude from the central portion OR1*a* to the upper left side. The second protrusion OR1*c* may protrude from the central portion OR1*a* toward the third opening region OB1. The third protrusion OR1*d* may protrude from the central portion OR1*a* in a direction opposite to the second protrusion OR1*c*.

The first opening region OR2 of the first-second unit pixel region UP12 may include a central portion OR2*a* and first to third protrusions OR2*b*, OR2*c* and OR2*d*. The first protrusion OR2*b* may protrude from the central portion OR2*a* toward the lower left side. The second protrusion OR2*c* may protrude from the central portion OR2*a* toward the upper left side. The third protrusion OR2*d* may protrude from the central portion OR2*a* in a direction opposite to the second protrusion OR2*c*.

The pixel circuit of the second sub-pixel of the first-first unit pixel region UP11 and a portion of the second opening region OG1 may be disposed in the first-first unit pixel region UP11, and the other portion of the second opening region OG1 may overlap the second-first unit pixel region UP21. The second opening region OG2 of the first-second unit pixel region UP12 may be disposed in the first-second unit pixel region UP12 to output green light.

The second opening region OG1 of the first-first unit pixel region UP11 may include a central portion OG1*a* and first to third protrusions OG1*b*, OG1*c* and OG1*d*. The first protrusion OG1*b* may protrude from the central portion OG1*a* to the lower right side. The second protrusion OG1*c* may protrude from the central portion OG1*a* toward the third opening region OB1. The third protrusion OG1*d* may protrude from the central portion OG1*a* in a direction opposite to the second protrusion OG1*c*.

The second opening region OG2 of the first-second unit pixel region UP12 may include a central portion OG2*a* and first to third protrusions OG2*b*, OG2*c* and OG2*d*. The first protrusion OG2*b* may protrude from the central portion OG2*a* toward the upper right side. The second protrusion OG2*c* may protrude from the central portion OR2*a* toward the upper left side. The third protrusion OG2*d* may protrude from the central portion OG2*a* in a direction opposite to the second protrusion OG2*c*.

The pixel circuit of the third sub-pixel of the second-first unit pixel region UP21 and a portion of the third opening region OB may be disposed in the second-first unit pixel region UP21, another portion of the third opening region OB may overlap the first-first unit pixel region UP11, and the remaining portion of the third opening region OB may overlap the second-second unit pixel region UP22.

The third opening region OB1 of the first-first unit pixel region UP11 may include a central portion OB1*a* and first to fourth protrusions OB1*b*, OB1*c*, OB1*d* and OB1*e*. The first protrusion OB1*b* may protrude from the central portion OB1*a* toward the first and second opening regions OR1 and OG1. The second protrusion OB1*c* may protrude from the central portion OB1*a* toward the lower right side. The third protrusion OB1*d* may protrude from the central portion OB1*a* in a direction opposite to the first protrusion OB1*b*. The fourth protrusion OB1*e* may protrude from the central portion OB1*a* in a direction opposite to the second protrusion OB1*c*.

The third opening region OB2 of the first-second unit pixel region UP12 may include a central portion OB2*a* and first to fourth protrusions OB2*b*, OB2*c*, OB2*d* and OB2*e*. The first protrusion OB2*b* may protrude from the central portion OB2*a* toward the second opening region OG2. The second protrusion OB2*c* may protrude from the central portion OB2*a* toward the lower right side. The third protrusion OB2*d* may protrude from the central portion OB2*a* in a direction opposite to the first protrusion OB2*b*. The fourth protrusion OB2*e* may protrude from the central portion OB2*a* in a direction opposite to the second protrusion OB2*c*.

As described above, the first opening region OR1 of the first-first unit pixel region UP11 may include the central portion OR1*a* and the first to third protrusions OR1*b*, OR1*c* and OR1*d*. The second opening region OG1 may include the central portion OG1*a* and the first to third protrusions Ob1*b*, OG1*c* and OG1*d*, and the third opening region OB1 may include the central portion OB1*a* and the first to fourth protrusions OB1*b*, OB1*c*, OB1*d* and OB1*e*, thereby maximizing the aperture ratio of the unit pixel region. A portion of at least one opening region of the opening regions OR, OG and OB of the sub-pixel may overlap the adjacent unit pixel region beyond the corresponding unit pixel region. Therefore, the display device 10 may improve the image quality of the display device 10 by maximizing an aperture ratio of the unit pixel region.

The first and second opening regions OR1 and OG1 of the first-first unit pixel region UP11 may be disposed between extension lines of both sides of the third opening region OB1. For example, the first and second opening regions OR1 and OG1 may be disposed side by side between the extension lines of the upper left side and the lower right side of the third opening region OB1. The long sides of each of the first and second opening regions OR1 and OG1 may be substantially parallel to the extension lines of the upper left side and the lower right side of the third opening region OB1. The first protrusion OB1*b* of the third opening region OB1 may face the second protrusion OR1*c* of the first opening region OR1 and the second protrusion OG1*c* of the second opening region OG1.

For example, the central portion OB1*a* of the third opening region OB1 may have a substantially square shape, and the central portions OR1*a* and OG1*a* of the first and second opening regions OR1 and OG1 may have a substantially rectangular shape smaller than the central portion OB1*a* of the third opening region OB1, but they are not necessarily limited thereto.

The first-first unit pixel region UP11 may include the first and second spacers S1 and S2. The first spacer S1 may be disposed on the upper side of the first opening region OR1 and may be disposed on the left side of the third opening region OB1. The second spacer S2 may be disposed on the right side of the second opening region OG1 and may be disposed on the lower side of the third opening region OB1. The first and second spacers S1 and S2 may be spaced apart from each other with the first to third opening regions OR1, OG1 and OB1 interposed therebetween, thereby stably supporting the first-first unit pixel region UP11 and improving the durability.

The first-second unit pixel region UP12 may include third and fourth spacers S3 and S4. The third spacer S3 may be disposed on the upper side of the second opening region OG2 and may be disposed on the left side of the third opening region OB2. The fourth spacer S4 may be disposed on the right side of the second opening region OG2 and may be disposed on the lower side of the third opening region OB2. The third and fourth spacers S3 and S4 may be spaced apart from each other with the first to third opening regions OR2, OG2 and OB2 interposed therebetween, thereby stably supporting the first-second unit pixel region UP12 and improving the durability.

A distance Lr2 between the center of gravity of the first opening region OR1 of the third-first unit pixel region UP31 and the center of gravity of the first opening region OR2 of the third-second unit pixel region UP32 may be greater than a distance Lr1 between the center of gravity of the first opening region OR1 of the third-first unit pixel region UP31 and the center of gravity of the first opening region OR1 of the fourth-first unit pixel region UP41 (Lr2>Lr1).

The first opening regions OR1 and OR2 may be regularly arranged by grouping two adjacent unit pixel regions into one group. For example, a distance between the center of gravity of the first opening region OR1 of the first-first unit pixel region UP11 and the center of gravity of the first opening region OR1 of the first-third unit pixel region UP13 may be equal to a distance between the center of gravity of the first opening region OR1 of the first-first unit pixel region UP11 and the center of gravity of the first opening region OR1 of the third-first unit pixel region UP31. Therefore, the first opening regions OR1 and OR2 of the first-first unit pixel region UP11 to the fourth-fourth unit pixel region UP44 may be regularly arranged by grouping two adjacent unit pixel regions into one group, thereby achieving uniform image quality.

A distance Lg2 between the center of gravity of the second opening region OG1 of the third-third unit pixel region UP33 and the center of gravity of the second opening region OG2 of the third-fourth unit pixel region UP34 may be greater than a distance Lg1 between the center of gravity of the second opening region OG1 of the third-third unit pixel region UP33 and the center of gravity of the second opening region OG1 of the fourth-third unit pixel region UP43 (Lg2>Lg1).

The second opening regions OG1 and OG2 may be regularly arranged by grouping two adjacent unit pixel regions into one group. For example, a distance between the center of gravity of the second opening region OG1 of the first-first unit pixel region UP11 and the center of gravity of the second opening region OG1 of the first-third unit pixel region UP13 may be equal to a distance between the center of gravity of the second opening region OG1 of the first-first unit pixel region UP11 and the center of gravity of the second opening region OG1 of the third-first unit pixel region UP31. Therefore, the second opening regions OG1 and OG2 of the first-first unit pixel region UP11 to the fourth-fourth unit pixel region UP44 may be regularly arranged by grouping two adjacent unit pixel regions into one group, thereby achieving uniform image quality.

A distance Lb between the center of gravity of the third opening region OB1 of the first-third unit pixel region UP13 and the center of gravity of the third opening region OB2 of the first-fourth unit pixel region UP14 may be equal to a distance Lb between the center of gravity of the third opening region OB1 of the first-third unit pixel region UP13 and the center of gravity of the third opening region OB1 of the second-third unit pixel region UP23 (Lb=Lb). Accordingly, the third opening regions OB1 and OB2 of the first-first unit pixel region UP11 to the fourth-fourth unit pixel region UP44 may be disposed at uniform intervals, thereby achieving uniform image quality.

A distance Ls between the center of gravity of the third spacer S3 of the second-second unit pixel region UP22 and the center of gravity of the first spacer S1 of the second-third unit pixel region UP23 may be equal to a distance Ls between the center of gravity of the third spacer S3 of the second-second unit pixel region UP22 and the center of gravity of the third spacer S3 of the third-second unit pixel region UP32 (Ls=Ls). The first to fourth spacers S1, S2, S3 and S4 may be disposed at uniform intervals, thereby stably supporting the first-first unit pixel region UP11 to the fourth-fourth unit pixel region UP44 and improving the durability of the display device 10.

One side of the opening region OR, OG, OB of at least one sub-pixel of the first to third sub-pixels may cross or intersect the scan line SL at a predetermined angle. The long sides of the central portions OR1a and OR2a of the first opening regions OR1 and OR2 may cross or intersect the scan line SL at a predetermined angle (not horizontal or vertical). The long sides of the central portions OG1a and OG2a of the second opening regions OG1 and OG2 may cross or intersect the scan line SL at a predetermined angle (not horizontal or vertical). One side of the central portions OB1a and OB2a of the third opening regions OB1 and OB2 may cross or intersect the scan line SL at a predetermined angle (not horizontal or vertical).

As described above, one side of the opening region OR, OG, OB of each of the sub-pixels may not be parallel to the scan line SL in a plan view, and may not cross or intersect the scan line SL at a right angle in a plan view. Thus, the display device 10 may minimize external light reflected at the boundary of the opening regions OR, OG and OB (for example, between the pixel defining layer and the opening region).

Figure 11:
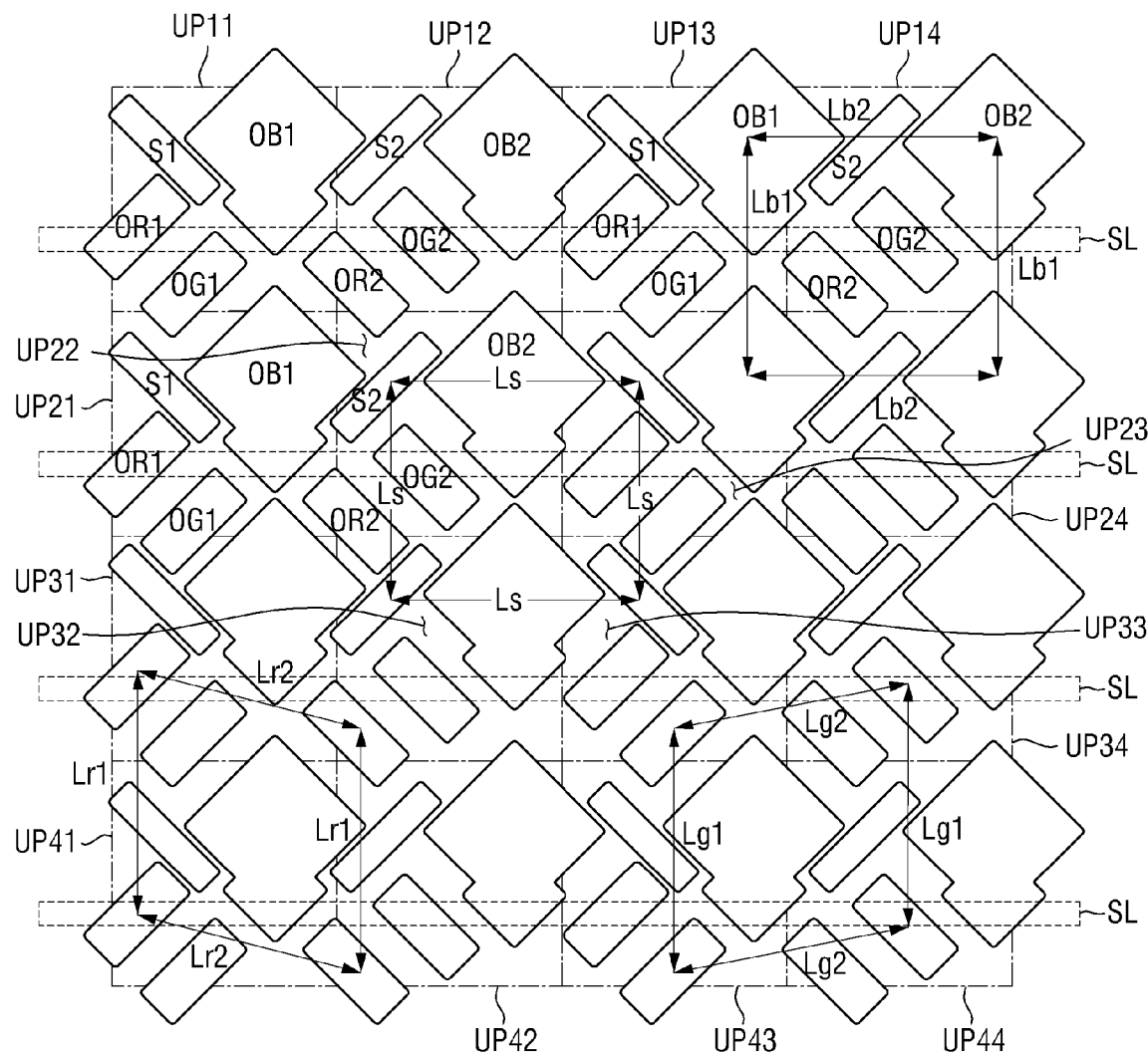
FIG. 11 is a plan view illustrating unit pixel regions of a display device according to an embodiment.
Figure 12:
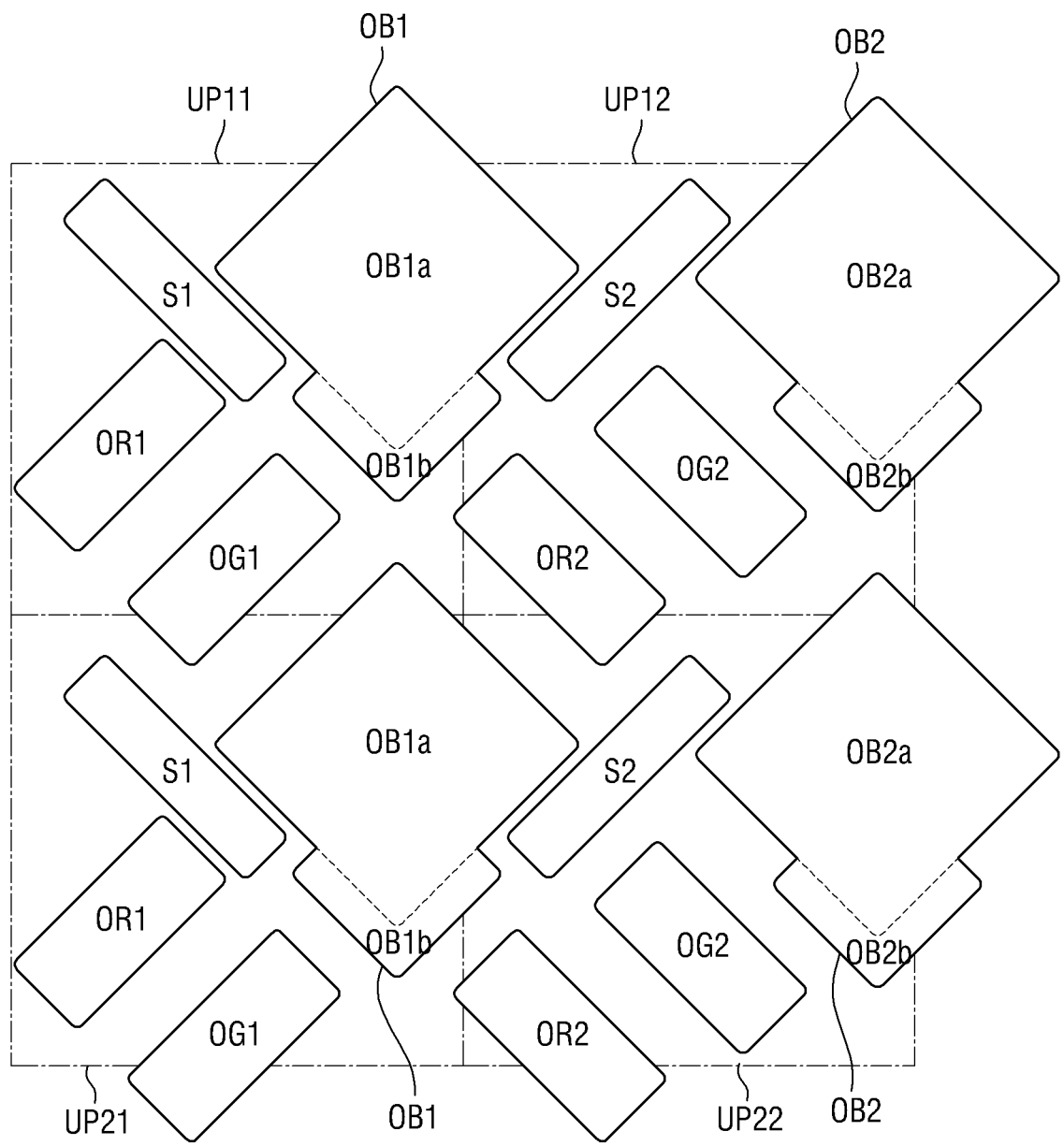
FIG. 12 is an enlarged view of the unit pixel regions of FIG. 11.

FIG. 11 is a plan view illustrating unit pixel regions of a display device according to an embodiment. FIG. 12 is an enlarged view of the unit pixel regions of FIG. 11. The unit pixel regions of FIGS. 11 and 12 may be different from the unit pixel regions of FIG. 7 in the configuration of the third opening regions OB1 and OB2. The same configuration as the above-described configuration will be briefly described or omitted.

Referring to FIGS. 11 and 12, the first opening region OR1, OR2 and the second opening region OG1, OG2 of each of the first-first unit pixel region UP11 to the fourth-fourth unit pixel region UP44 may be disposed side by side on the lower left side of the third opening region OB1, OB2. The first opening region OR1 of the first-first unit pixel region UP11 may be disposed on the upper left side of the second opening region OG1 of the first-first unit pixel region UP11, and the first opening region OR2 of the first-second unit pixel region UP12 may be disposed on the lower left side of the second opening region OG2 of the first-second unit pixel region UP12. The first to third opening regions OR, OG and OB may be regularly arranged by grouping two adjacent unit pixel regions into one group.

The third opening region OB1 of the first-first unit pixel region UP11 may include a central portion OB1a and a protrusion OB1b protruding downward from the lower corner of the central portion OB1a. One end of the protrusion OB1b of the third opening region OB1 of the first-first unit pixel region UP11 may face the second opening region OG1 of the first-first unit pixel region UP11, and the other end substantially perpendicular to one end of the protrusion OB1b of the third opening region OB1 may face the first opening region OR2 of the first-second unit pixel region UP12.

As described above, the third opening region OB1, OB2 of each of the first-first unit pixel region UP11 to the fourth-fourth unit pixel region UP44 may include the central portion OB1a, OB2a and the protrusion OB1b, OB2b, thereby maximizing the aperture ratio of the unit pixel region.

For example, the central portion OB1a of the third opening region OB1 may have a substantially square shape, and the first and second opening regions OR1 and OG1 may have a substantially rectangular shape smaller than the central portion OB1*a* of the third opening region OB1, but they are not necessarily limited thereto.

The first-first unit pixel region UP11 may include a first spacer S1. The first spacer S1 may be disposed between the first opening region OR1 and the third opening region OB1. For example, the first spacer S1 may be surrounded by or adjacent to the first opening region OR1, one end of the protrusion OB1*b* of the third opening region OB1, and the left corner of the third opening region OB1. The first spacer S1 may alleviate the shock transmitted to the first-first unit pixel region UP11.

The first-second unit pixel region UP12 may include a second spacer S2. The second spacer S2 may be disposed on the upper left side of the second opening region OG2 and the third opening region OB2. For example, the second spacer S2 may be surrounded by or adjacent to the right corner of the central portion OB1*a* of the third opening region OB1 of the first-first unit pixel region UP11, the other end of the protrusion OB1*b* of the third opening region OB1 of the first-first unit pixel region UP11, the second opening region OG2 of the first-second unit pixel region UP12, and the left corner of the central portion OB2*a* of the third opening region OB2 of the first-second unit pixel region UP12. The second spacer S2 may alleviate the shock transmitted to the first-second unit pixel region UP12.

Figure 13:
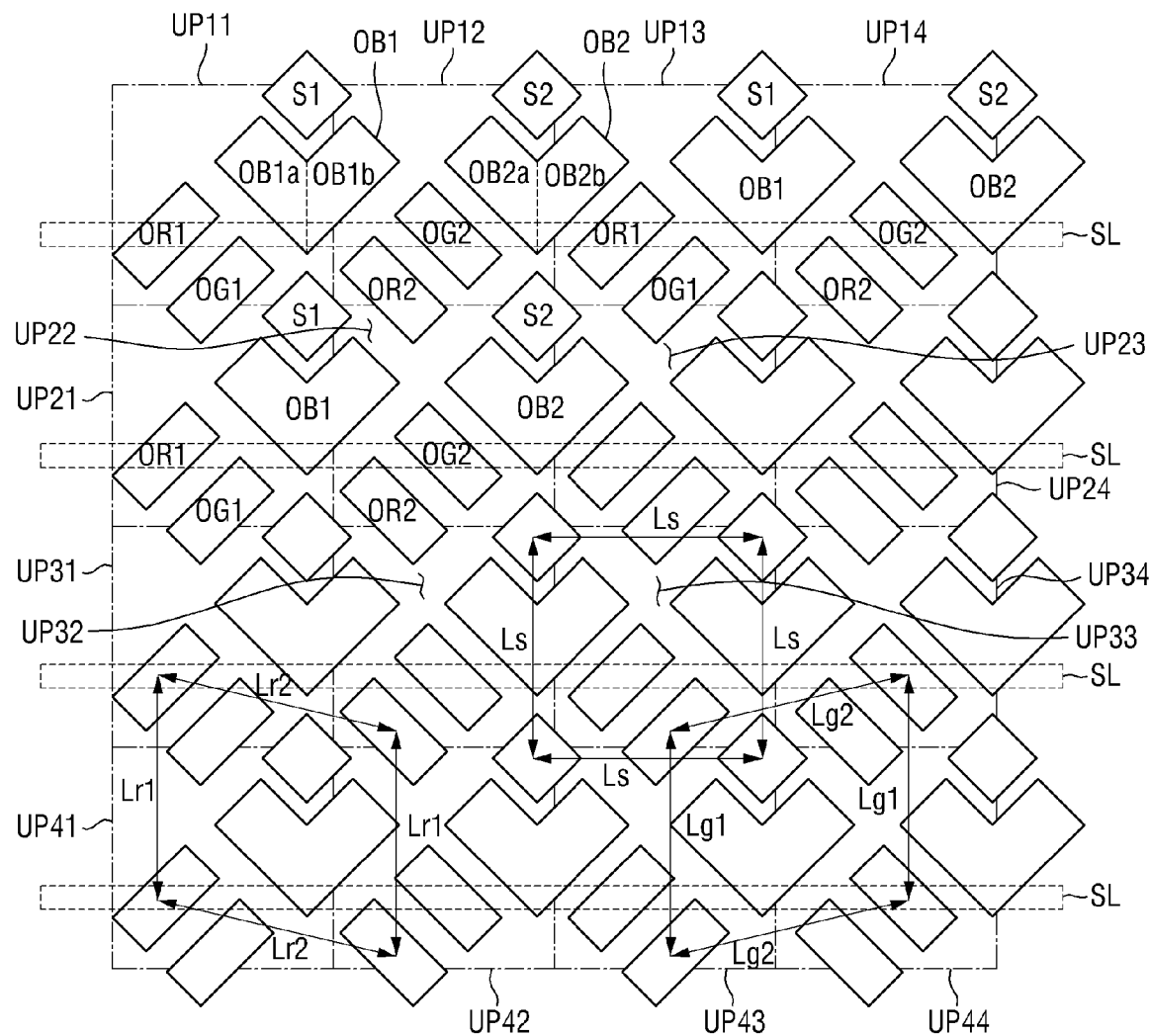
FIG. 13 is a plan view illustrating unit pixel regions of a display device according to an embodiment.
Figure 13:
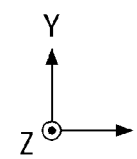

FIG. 13 is a plan view illustrating unit pixel regions of a display device according to an embodiment. The unit pixel regions of FIG. 13 may be different from the unit pixel regions of FIG. 7 in the configuration of the third opening regions OB1 and OB2 and the first and second spacers S1 and S2. The same configuration as the above-described configuration will be briefly described or omitted.

Referring to FIG. 13, the first opening region OR1, OR2 and the second opening region OG1, OG2 of each of the first-first unit pixel region UP11 to the fourth-fourth unit pixel region UP44 may be disposed side by side on the lower left side of the third opening region OB1, OB2. The first opening region OR1 of the first-first unit pixel region UP11 may be disposed on the upper left side of the second opening region OG1 of the first-first unit pixel region UP11, and the first opening region OR2 of the first-second unit pixel region UP12 may be disposed on the lower left side of the second opening region OG2 of the first-second unit pixel region UP12. The first to third opening regions OR, OG and OB may be regularly arranged by grouping two adjacent unit pixel regions into one group.

The third opening region OB1 of the first-first unit pixel region UP11 may include an end OB1*a* extending toward the upper left side from the center of gravity and the other end OB1*b* extending toward the upper right side from the center of gravity. The end OB1*a* extending toward the upper left side from the center of gravity and the other end OB1*b* extending toward the upper right side from the center of gravity may form a substantially chevron shape in a plan view. The first and second opening regions OR1 and OG1 of the first-first unit pixel region UP11 may be disposed on the lower left side of one end OB1*a* of the third opening region OB1, and the first and second opening regions OR2 and OG2 of the first-second unit pixel region UP12 may be disposed on the lower right side of the other end OB1*b* of the third opening region OB1 of the first-first unit pixel region UP11.

As described above, the third opening region OB1, OB2 of each of the first-first unit pixel region UP11 to the fourth-fourth unit pixel region UP44 may include one end OB1*a*, OB2*a* and the other end OB1*b*, OB2*b*, thereby maximizing the aperture ratio of the unit pixel region.

The second-first unit pixel region UP21 may include a first spacer S1. The first spacer S1 of the second-first unit pixel region UP21 may be surrounded by or adjacent to the second and third opening regions OG1 and OB1 of the first-first unit pixel region UP11, the first opening region OR2 of the first-second unit pixel region UP12, and the third opening region OB1 of the second-first unit pixel region UP21. The first spacer S1 may alleviate the shock transmitted to the second-first unit pixel region UP21.

The second-second unit pixel region UP22 may include a second spacer S2. The second spacer S2 of the second-second unit pixel region UP22 may be surrounded by or adjacent to the second and third opening regions OG2 and OB2 of the first-second unit pixel region UP12, the first opening region OR1 of the first-third unit pixel region UP13, and the third opening region OB2 of the second-second unit pixel region UP22. The second spacer S2 may alleviate the shock transmitted to the second-second unit pixel region UP22.

It is to be understood that the arrangement of the spacers with respect to the unit pixel regions and the opening regions is not limited to the above descriptions and illustrations. Other arrangements and configurations are within the spirit and the scope of the disclosure.

Figure 14:
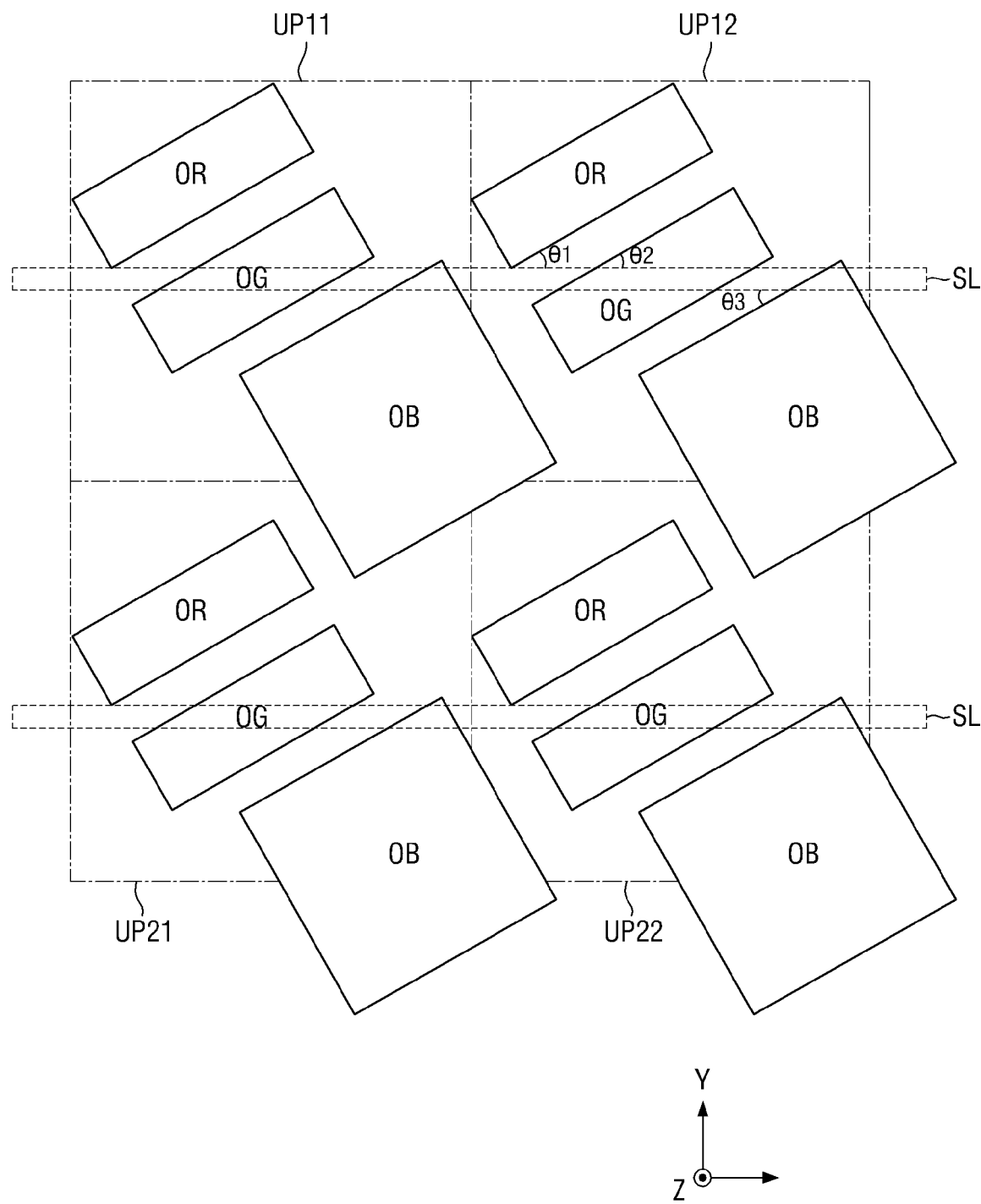
FIG. 14 is a plan view illustrating unit pixel regions of a display device according to an embodiment.
Figure 15:
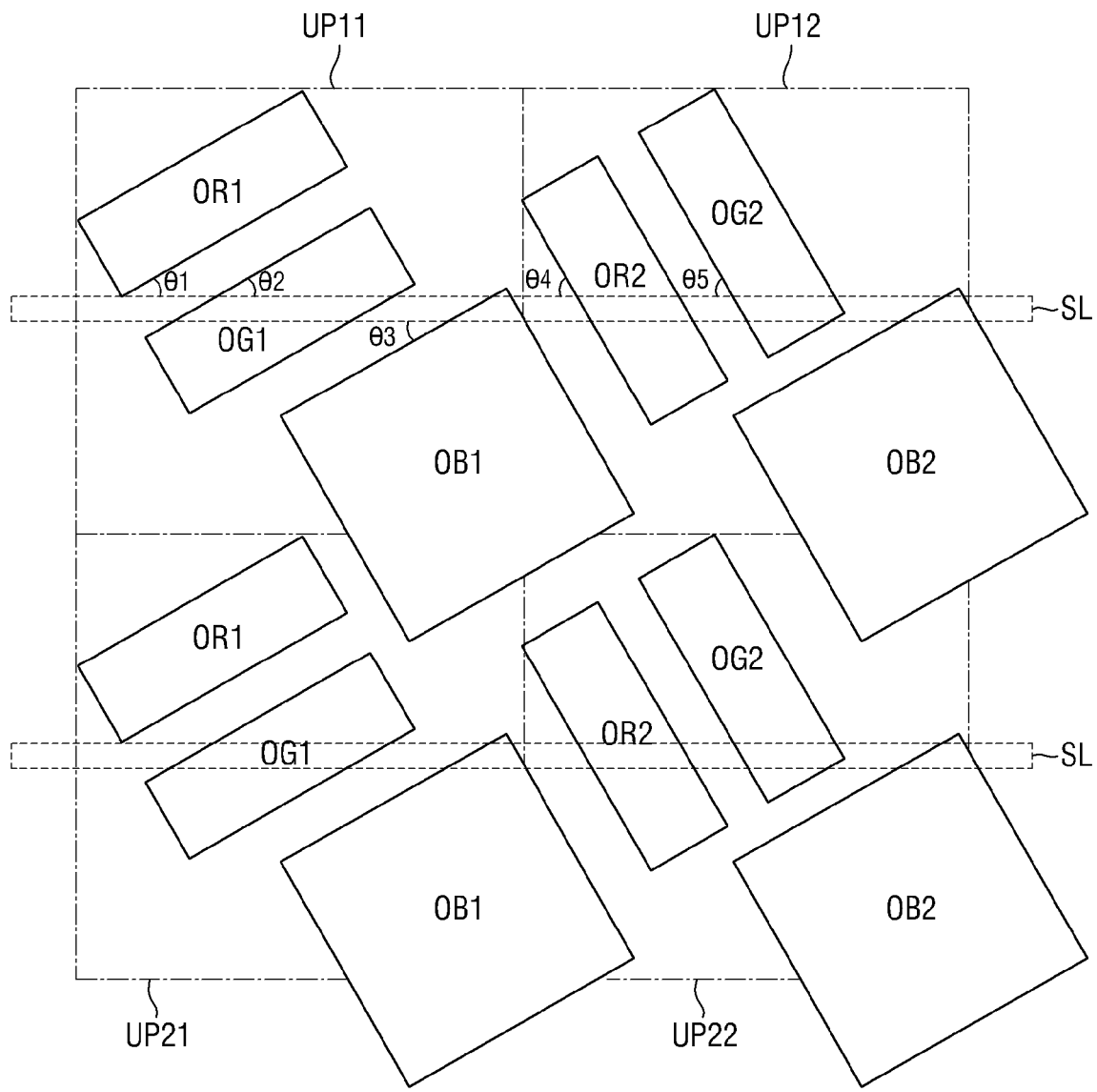
FIG. 15 is a plan view illustrating unit pixel regions of a display device according to an embodiment.
Figure 16:
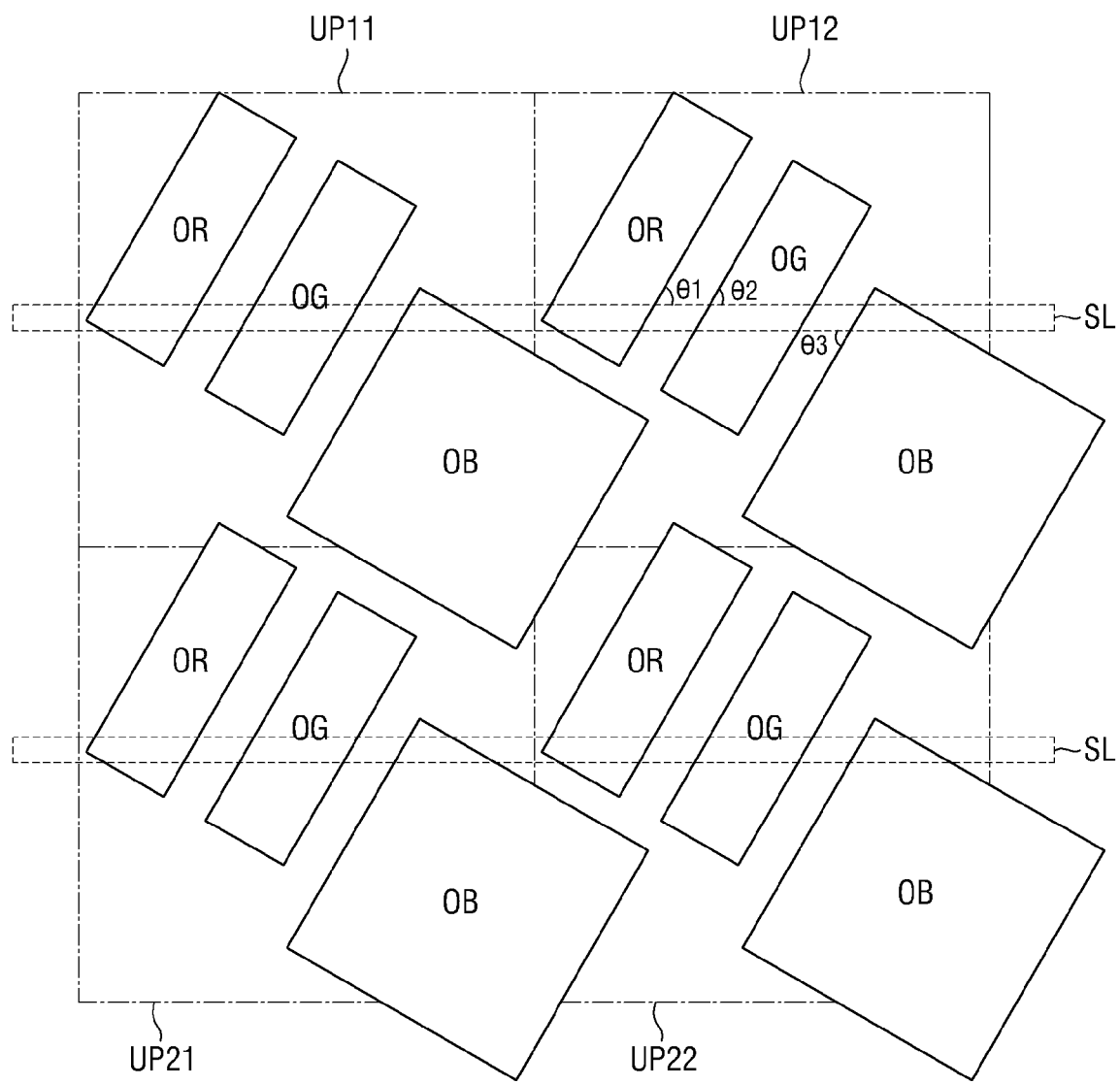
FIG. 16 is a plan view illustrating unit pixel regions of a display device according to an embodiment.
Figure 17:
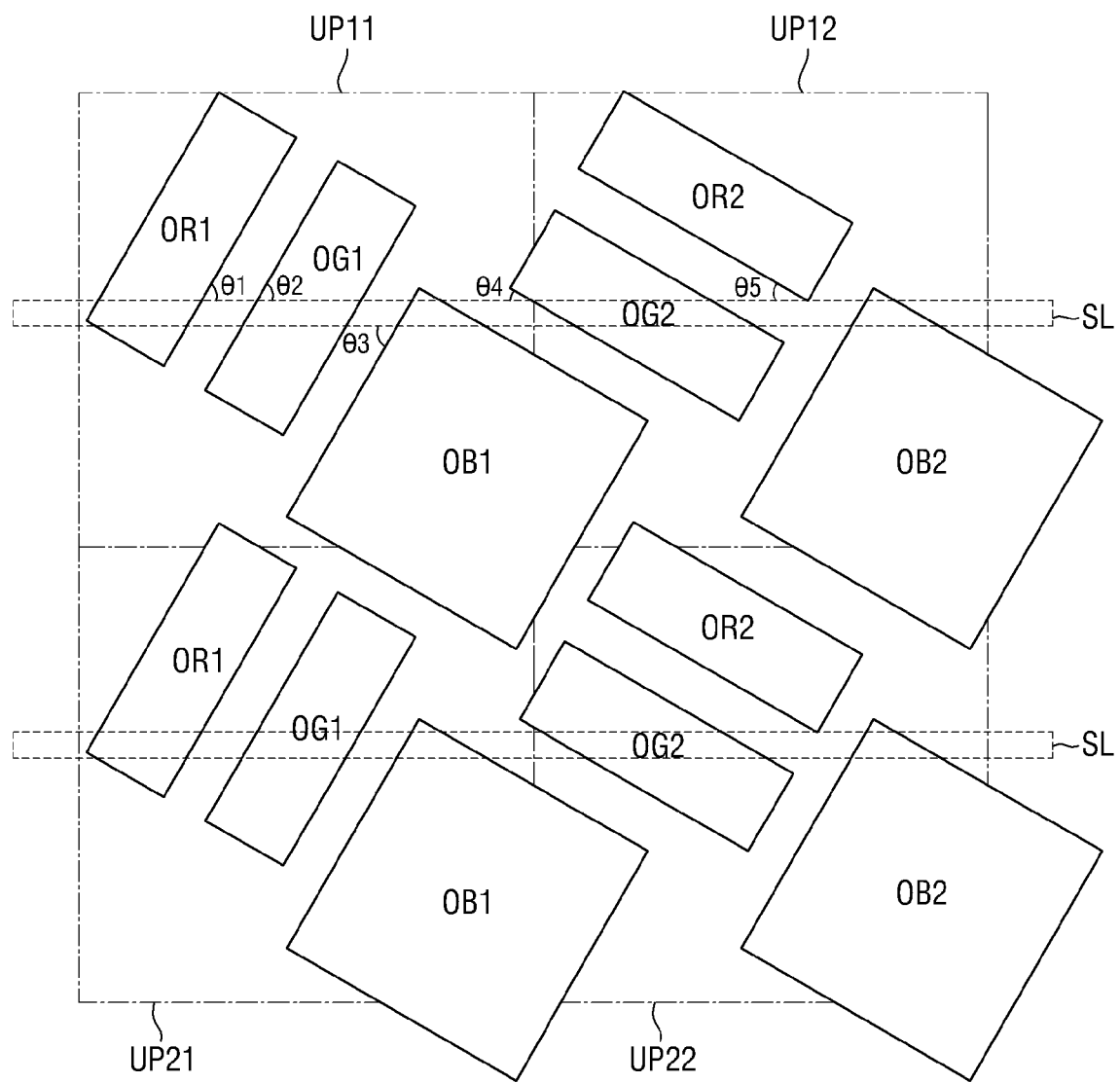
FIG. 17 is a plan view illustrating unit pixel regions of a display device according to an embodiment.

FIG. 14 is a plan view illustrating unit pixel regions of a display device according to an embodiment. FIG. 15 is a plan view illustrating unit pixel regions of a display device according to an embodiment. FIG. 16 is a plan view illustrating unit pixel regions of a display device according to an embodiment. FIG. 17 is a plan view illustrating unit pixel regions of a display device according to an embodiment. The unit pixel regions of FIGS. 14 to 17 may be different from the unit pixel regions of FIG. 5 in the inclination of the first to third opening regions OR, OG and OB. The same configuration as the above-described configuration will be briefly described or omitted.

Referring to FIGS. 14 to 17, each of the first-first unit pixel region UP11 to the second-second unit pixel region UP22 may include first to third sub-pixels.

In FIG. 14, an on-plane angle $\theta 1$ between the long side of the first opening region OR and the scan line SL may be about 30 degrees. An on-plane angle $\theta 2$ between the long side of the second opening region OG and the scan line SL may be about 30 degrees. An on-plane angle $\theta 3$ between one side of the third opening region OB and the scan line SL may be about 30 degrees.

In FIG. 15, an on-plane angle $\theta 1$ between the long side of the first opening region OR1 of the first-first unit pixel region UP11 and the scan line SL may be about 30 degrees. An on-plane angle $\theta 2$ between the long side of the second opening region OG1 of the first-first unit pixel region UP11 and the scan line SL may be about 30 degrees. An on-plane angle $\theta 3$ between one side of the third opening region OB1 and the scan line SL may be about 30 degrees.

An on-plane angle $\theta 4$ between the long side of the first opening region OR2 of the first-second unit pixel region UP12 and the scan line SL may be about 60 degrees. An on-plane angle $\theta 5$ between the long side of the second opening region OG2 of the first-second unit pixel region UP12 and the scan line SL may be about 60 degrees.

In FIG. 16, an on-plane angle $\theta 1$ between the long side of the first opening region OR and the scan line SL may be about 60 degrees. An on-plane angle $\theta 2$ between the long side of the second opening region OG and the scan line SL may be about 60 degrees. An on-plane angle $\theta 3$ between one side of the third opening region OB and the scan line SL may be about 60 degrees.

In FIG. 17, an on-plane angle θ1 between the long side of the first opening region OR1 of the first-first unit pixel region UP11 and the scan line SL may be about 60 degrees. An on-plane angle θ2 between the long side of the second opening region OG1 of the first-first unit pixel region UP11 and the scan line SL may be about 60 degrees. An on-plane angle θ3 between one side of the third opening region OB and the scan line SL may be about 60 degrees.

An on-plane angle θ4 between the long side of the first opening region OR2 of the first-second unit pixel region UP12 and the scan line SL may be about 30 degrees. An on-plane angle θ5 between the long side of the second opening region OG2 of the first-second unit pixel region UP12 and the scan line SL may be about 30 degrees.

In conjunction with FIGS. 5, 6 and 14 to 17, the first to third opening regions OR, OG and OB of the display device 10 may have aperture ratios as shown in Table 1 below.

TABLE 1

|  | PDL Gap about 23 μm | PDL Gap about 20 μm |
| --- | --- | --- |
| Structure 1 | 30.00% | 33.20% |
| Structure 2 | 44.95% | 50.50% |
| Structure 3 | 44.99% | 50.50% |
| Structure 4 | 44.95% | 50.50% |

Here, Structure 1 represents a display device in which opening regions may be disposed only within the corresponding unit pixel region. Different from the display device according to the disclosure, the opening regions of Structure 1 may be configured such that a portion of the opening region may not overlap the adjacent unit pixel region beyond the corresponding unit pixel region. In Structure 1, the opening regions OR, OG and OB and the scan line SL may cross or intersect each other at an angle of about 30 degrees.

Structure 2 represents a display device in which the opening regions OR, OG and OB and the scan line SL may cross or intersect each other at an angle of about 30 degrees. For example, Structure 2 may represent the display device 10 illustrated in FIG. 14 or 15.

Structure 3 represents a display device in which the opening regions OR, OG and OB and the scan line SL may cross or intersect each other at an angle of about 45 degrees. For example, Structure 3 may represent the display device 10 illustrated in FIG. 5 or 6.

Structure 4 represents a display device in which the opening regions OR, OG and OB and the scan line SL may cross or intersect each other at an angle of about 60 degrees. For example, Structure 4 may represent the display device 10 illustrated in FIG. 16 or 17.

Therefore, Structure 2, Structure 3 and Structure 4 according to the disclosure may have a higher aperture ratio than Structure 1 in a case that the gap of the pixel defining layer PDL is about 23 μm or about 20 μm. Thus, the display device 10 may be configured such that a portion of the at least one opening region of the opening regions OR, OG and OB may overlap the adjacent unit pixel region beyond the corresponding unit pixel region. By maximizing the aperture ratio of the unit pixel region, the image quality of the display device 10 may be improved.

Referring to FIGS. 5 and 6, the unit pixel regions of the display device 10 may have reflected light as shown in Table 2 below.

TABLE 2

|  | Reflected light (nit) |
| --- | --- |
| Structure 5 | 660 |
| Structure 6 | 154 |
| Structure 7 | 78 |

Here, Structure 5 represents a display device in which one side of the opening regions may be disposed horizontally or vertically with respect to the scan line SL. Different from the display device according to the disclosure, the opening regions of Structure 5 may be configured such that one side of the opening region may not cross or intersect the scan line SL at an angle (non-vertical or horizontal) in a plan view.

Structure 6 represents a display device in which the opening regions OR, OG and OB and the scan line SL may cross or intersect each other at an angle of about 45 degrees. For example, Structure 6 may represent the display device 10 illustrated in FIG. 5 or 6.

Structure 7 represents a display device in which the opening regions OR, OG and OB and the scan line SL may cross or intersect each other at an angle of about 45 degrees, and the pixel defining layer PDL may include a light absorbing material.

Therefore, in Structure 6 of the disclosure, since the opening regions OR, OG and OB may not cross or intersect the scan line SL at a right angle without being parallel to the scan line SL, external light reflected at the boundary of the opening region may be minimized. Since Structure 7 of the disclosure may include a light absorbing material in Structure 6, it may be possible to further reduce the amount of reflection of external light.

Figure 18:
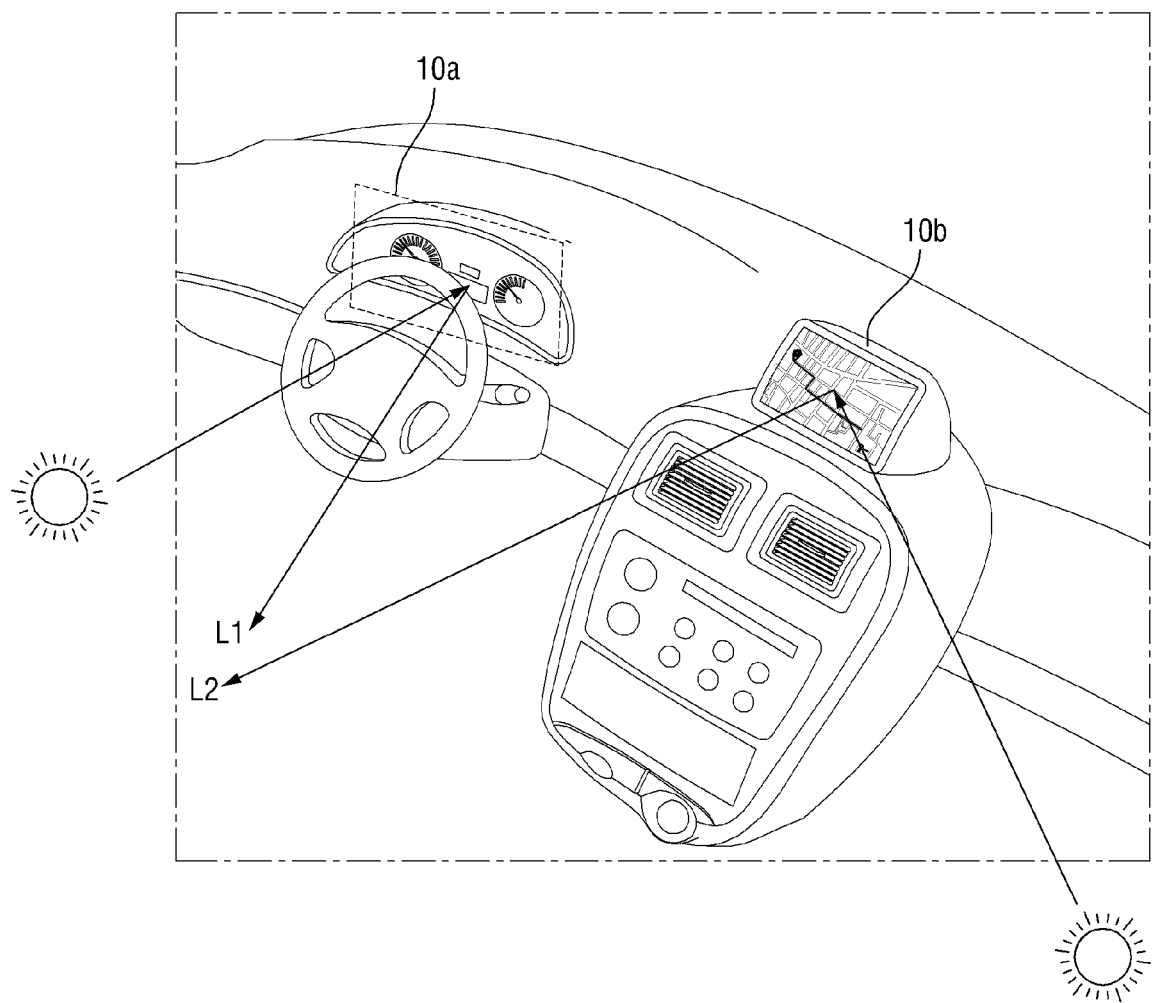
FIG. 18 is a diagram illustrating an example in which a display device according to an embodiment is applied to a vehicle.
Figure 19:
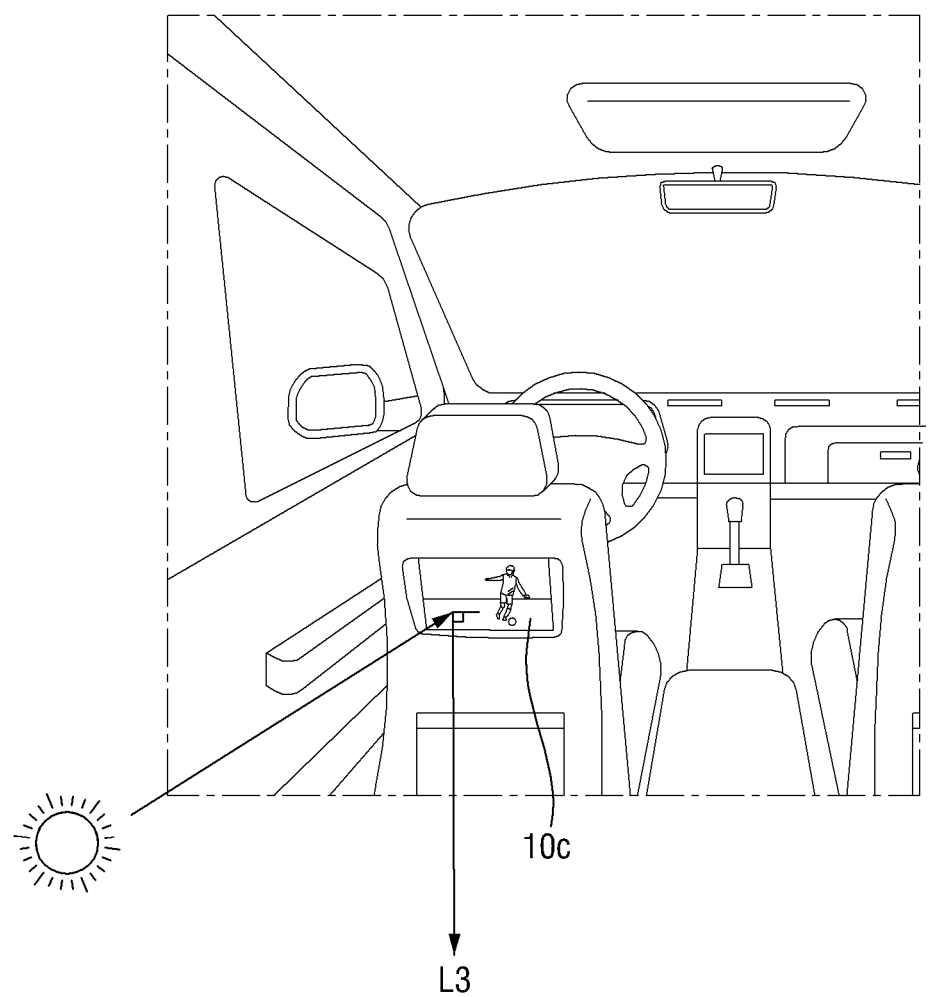
FIG. 19 is a diagram illustrating an example in which a display device according to an embodiment is applied to a vehicle.

FIG. 18 is a diagram illustrating an example in which a display device according to an embodiment is applied to a vehicle. FIG. 19 is a diagram illustrating an example in which a display device according to an embodiment is applied to a vehicle.

Referring to FIGS. 18 and 19, the display device may be used as a display device 10a applied to the dashboard of a vehicle, a display device 10b applied to the center fascia of a vehicle, and a display device 10c disposed on the rear surface of the front seat for entertainment for the rear seat of a vehicle.

The display devices 10a, 10b and 10c according to the disclosure may maximize the aperture ratio of each of the sub-pixels while minimizing the external light L1, L2 and L3 reflected at the boundary of the opening region, thereby improving visibility and reliability.

While the disclosure has been illustrated and described with reference to embodiments thereof, it will be understood by those of ordinary skill in the art that various changes in form and detail may be made therein without departing from the spirit and scope of the disclosure as defined by the following claims. The embodiments should be considered in a descriptive sense only and not for purposes of limitation.

What is claimed is:
1. A display device comprising:
scan lines disposed in a first direction;
data lines disposed in a second direction substantially perpendicular to the first direction; and
a plurality of unit pixel regions adjacent to the scan lines and the data lines, each unit pixel region including a first sub-pixel to emit a first color, a second sub-pixel to emit a second color, and a third sub-pixel to emit a third color, the first color, the second color, and the third color being different from each other, wherein a longest side of an opening region of the at least one of the plurality of sub-pixels for a first unit pixel region extends in a third direction inclined with respect to each of the first direction and the second direction, at least one sub-pixel is disposed completely within its unit pixel region, and at least another sub-pixel extends into an adjacent unit pixel region.

2. The display device of claim 1, wherein
the first side of each of the first to third opening region extends in a third direction intersecting the first direction and the second direction.

3. The display device of claim 1, wherein
a portion of the third opening region overlaps a unit pixel region adjacent to a unit pixel region including the third opening region in the first direction, and
another portion of the third opening region overlaps a unit pixel region adjacent to the unit pixel region including the third opening region in the second direction.

4. The display device of claim 1, wherein
the plurality of unit pixel regions include:
a first unit pixel region; and
a second unit pixel region adjacent to the first unit pixel region in the first direction,
a first opening region of the first unit pixel region is disposed in a third direction of a second opening region of the first unit pixel region, the third direction intersects the first direction and the second direction, and
a first opening region of the second unit pixel region is disposed in a fourth direction of a second opening region of the second unit pixel region, the fourth direction is substantially perpendicular to the third direction.

5. The display device of claim 4, wherein
the plurality of unit pixel regions further include:
a third unit pixel region adjacent to the first unit pixel region in the second direction; and
a fourth unit pixel region adjacent to the second unit pixel region in the second direction,
a portion of the second opening region of the first unit pixel region overlaps the third unit pixel region, and
a portion of the first opening region of the second unit pixel region overlaps the fourth unit pixel region.

6. The display device of claim 5, wherein
a portion of a third opening region of the third unit pixel region overlaps the first unit pixel region, and
another portion of the third opening region of the third unit pixel region overlaps the fourth unit pixel region.

7. The display device of claim 1, further comprising:
a first substrate on which the plurality of unit pixel regions are disposed; and
a second substrate facing the first substrate, wherein
the plurality of unit pixel regions include:
a first unit pixel region; and
a second unit pixel region adjacent to the first unit pixel region in the first direction,
the first unit pixel region includes a first spacer disposed between the first substrate and the second substrate, and
the second unit pixel region includes a second spacer disposed between the first substrate and the second substrate.

8. The display device of claim 7, wherein
the first spacer is disposed between the first opening region and the third opening region of the first unit pixel region.

9. The display device of claim 7, wherein
the second opening region of the second unit pixel region is disposed between the first opening region and the third opening region of the second unit pixel region, and
the second spacer is disposed in a third direction of the second and third opening regions of the second unit pixel region, the third direction intersects the first direction and the second direction.

10. The display device of claim 7, wherein
the plurality of unit pixel regions further include:
a third unit pixel region adjacent to the first unit pixel region in the second direction; and
a fourth unit pixel region adjacent to the second unit pixel region in the second direction,
a portion of a second opening region of the first unit pixel region overlaps the third unit pixel region, and
a portion of a first opening region of the second unit pixel region overlaps the fourth unit pixel region.

11. The display device of claim 10, wherein
a portion of a third opening region of the third unit pixel region overlaps the first unit pixel region, and
another portion of the third opening region of the third unit pixel region overlaps the fourth unit pixel region.

12. The display device of claim 1, further comprising:
a first substrate on which the plurality of unit pixel regions are disposed; and
a second substrate facing the first substrate, wherein
the plurality of unit pixel regions include:
a first unit pixel region; and
a second unit pixel region adjacent to the first unit pixel region in the first direction,
the first unit pixel region includes first and second spacers disposed between the first substrate and the second substrate, and
the second unit pixel region includes third and fourth spacers disposed between the first substrate and the second substrate.

13. The display device of claim 12, wherein a first opening region of the first unit pixel region includes:
a central portion;
a first protrusion protruding in a third direction of the central portion, the third direction intersects the first direction and the second direction;
a second protrusion protruding from the central portion toward the third opening region; and
a third protrusion protruding from the central portion in a direction opposite to the second protrusion, wherein a second opening region of the first unit pixel region includes:
a central portion;
a first protrusion protruding in a direction opposite to the third direction of the central portion;
a second protrusion protruding from the central portion toward the third opening region; and
a third protrusion protruding from the central portion in a direction opposite to the second protrusion, and
wherein a third opening region of the first unit pixel region includes:
a central portion;
a first protrusion protruding from the central portion toward first and second opening regions;
a second protrusion protruding in the third direction of the central portion;
a third protrusion protruding from the central portion in a direction opposite to the first protrusion; and
a fourth protrusion protruding from the central portion in a direction opposite to the second protrusion.

14. The display device of claim 13, wherein
the second protrusion of the first opening region, the second protrusion of the second opening region, and the first protrusion of the third opening region of the first unit pixel region are disposed between the first and second spacers.

15. The display device of claim 13, wherein
a portion of the second opening region and a portion of the third opening region of the second unit pixel region are disposed between the third and fourth spacers.

16. The display device of claim 1, wherein
the third opening region includes:
a central portion; and
a protrusion protruding from a lower corner of the central portion to the second direction.

17. The display device of claim 16, wherein
the plurality of unit pixel regions include:
a first unit pixel region; and
a second unit pixel region adjacent to the first unit pixel region in the first direction,
an end of a protrusion of a third opening region of the first unit pixel region faces a second opening region of the first unit pixel region, and
another end substantially perpendicular to the end of the protrusion of the third opening region faces a first opening region of the second unit pixel region.

18. The display device of claim 17, wherein
the first unit pixel region further includes a first spacer surrounded by the first opening region, the end of the protrusion of the third opening region, and a left corner of the central portion of the third opening region.

19. The display device of claim 1, wherein
the plurality of unit pixel regions include:
a first unit pixel region; and
a second unit pixel region adjacent to the first unit pixel region in the first direction,
the third opening region includes:
an end extending in a third direction from a center of gravity, the third direction intersects the first direction and the second direction; and
another end extending in a fourth direction from the center of gravity, the fourth direction is substantially perpendicular to the third direction.

20. The display device of claim 19, wherein
the plurality of unit pixel regions further include a third unit pixel region adjacent to the first unit pixel region in the second direction, and
the third unit pixel region includes a first spacer surrounded by the second and third opening regions of the first unit pixel region, the first opening region of the second unit pixel region, and the third opening region of the third unit pixel region.

* * * * *